United States Patent
Shimizu et al.

(10) Patent No.: US 7,471,322 B2
(45) Date of Patent: Dec. 30, 2008

(54) SOLID STATE IMAGING DEVICE AND DRIVING METHOD THEREOF

(75) Inventors: Izumi Shimizu, Kyoto (JP); Toshiya Fujii, Shiga (JP); Kunihiro Imamura, Kyoto (JP); Keijirou Itakura, Osaka (JP)

(73) Assignee: Panasonic Corporation, Osaka (JP)

( * ) Notice: Subject to any disclaimer, the term of this patent is extended or adjusted under 35 U.S.C. 154(b) by 801 days.

(21) Appl. No.: 11/037,220

(22) Filed: Jan. 19, 2005

(65) Prior Publication Data

US 2005/0157191 A1   Jul. 21, 2005

(30) Foreign Application Priority Data

Jan. 21, 2004   (JP) .............................. 2004-013609

(51) Int. Cl.
H04N 3/14 (2006.01)
H04N 5/335 (2006.01)
H04N 1/46 (2006.01)

(52) U.S. Cl. ...................... 348/272; 348/294; 348/273; 358/513

(58) Field of Classification Search ......... 348/294–324, 348/272, 266; 358/513
See application file for complete search history.

(56) References Cited

U.S. PATENT DOCUMENTS

| | | | |
|---|---|---|---|
| 6,686,960 B2 * | 2/2004 | Iizuka | 348/273 |
| 6,882,366 B1 * | 4/2005 | Kijima et al. | 348/294 |
| 6,885,399 B1 * | 4/2005 | Kawashiri | 348/273 |
| 6,888,568 B1 * | 5/2005 | Neter | 348/222.1 |
| 6,992,714 B1 * | 1/2006 | Hashimoto et al. | 348/273 |
| 7,212,237 B2 * | 5/2007 | Watanabe | 348/240.2 |
| 7,385,638 B2 * | 6/2008 | Parks | 348/311 |
| 2002/0154347 A1 * | 10/2002 | Funakoshi et al. | 358/513 |
| 2003/0020819 A1 * | 1/2003 | Fukuda | 348/246 |

FOREIGN PATENT DOCUMENTS

| | | |
|---|---|---|
| JP | 2001-036920 | 2/2001 |
| JP | 2001-292453 | 10/2001 |

* cited by examiner

*Primary Examiner*—David L Ometz
*Assistant Examiner*—Pritham Prabhakher
(74) *Attorney, Agent, or Firm*—McDermott Will & Emery LLP

(57) ABSTRACT

A solid state imaging device of the present invention comprises a solid state imaging element which includes a plurality of photoelectric conversion elements arranged in a matrix. In the solid state imaging device of the present invention, a pixel mixture unit area includes q pixels (q is a natural number equal to or greater than 2) in the first direction of the solid state imaging element and p pixels (p is a natural number equal to or greater than 2) in the second direction that crosses the first direction. The solid state imaging device includes: means for performing a first-field pixel addition process of adding together electric charges of a plurality of pixels included in the plurality of pixel mixture unit areas and a second-field pixel addition process of adding together the electric charges of the plurality of pixels included in the plurality of pixel mixture unit areas based on a combination of the pixel mixture unit areas which is different from that of the first-field pixel addition process; and means for alternately outputting signals of the electric charges obtained in the first-field pixel addition process and second-field pixel addition process as signals for interlaced scanning.

20 Claims, 20 Drawing Sheets

FIG. 3
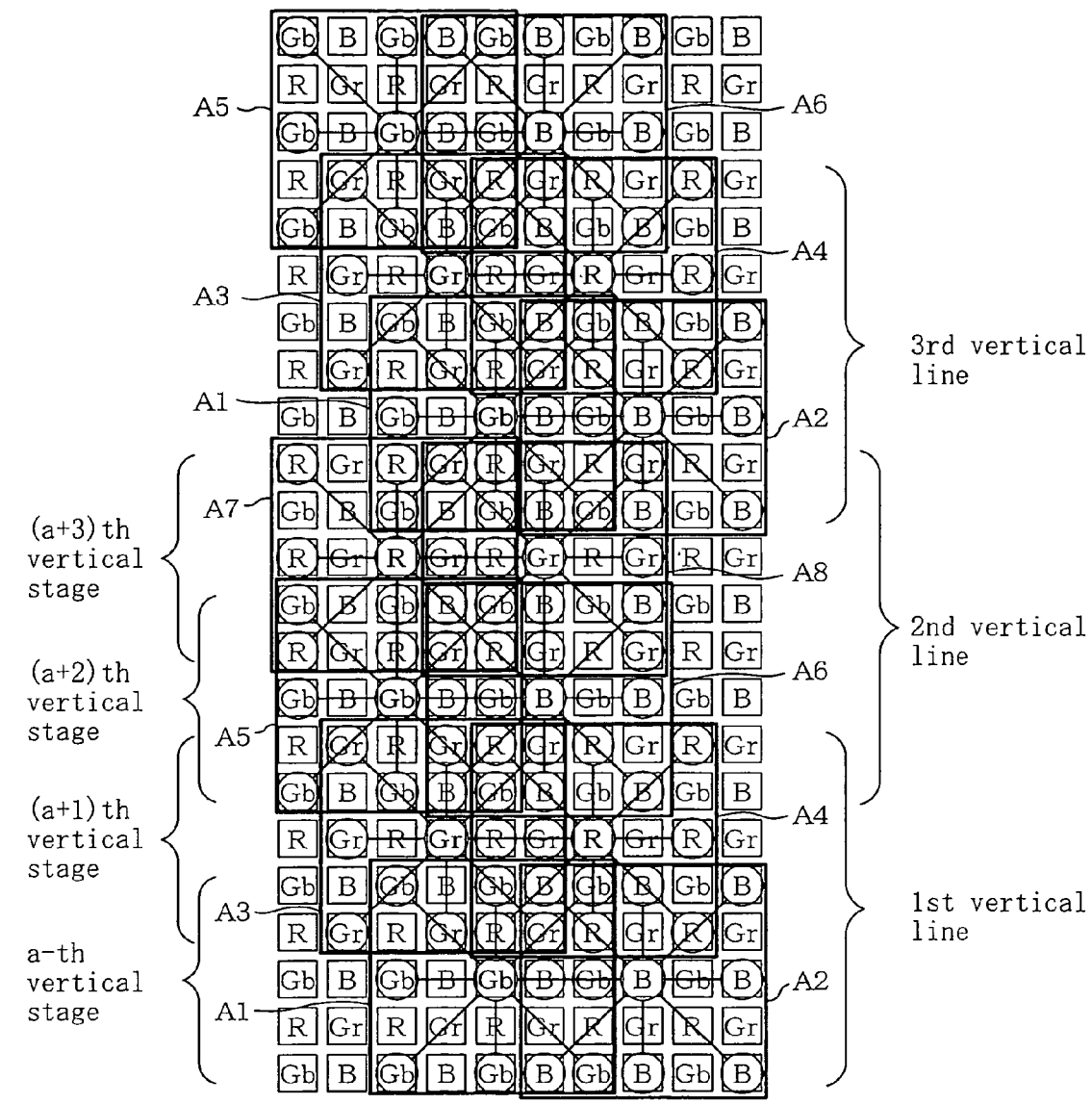
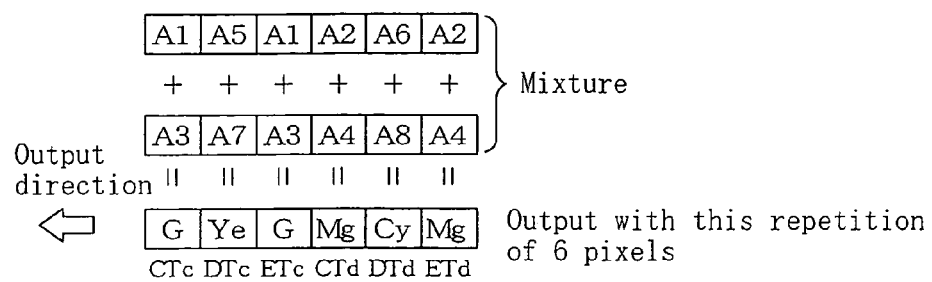

FIG. 4
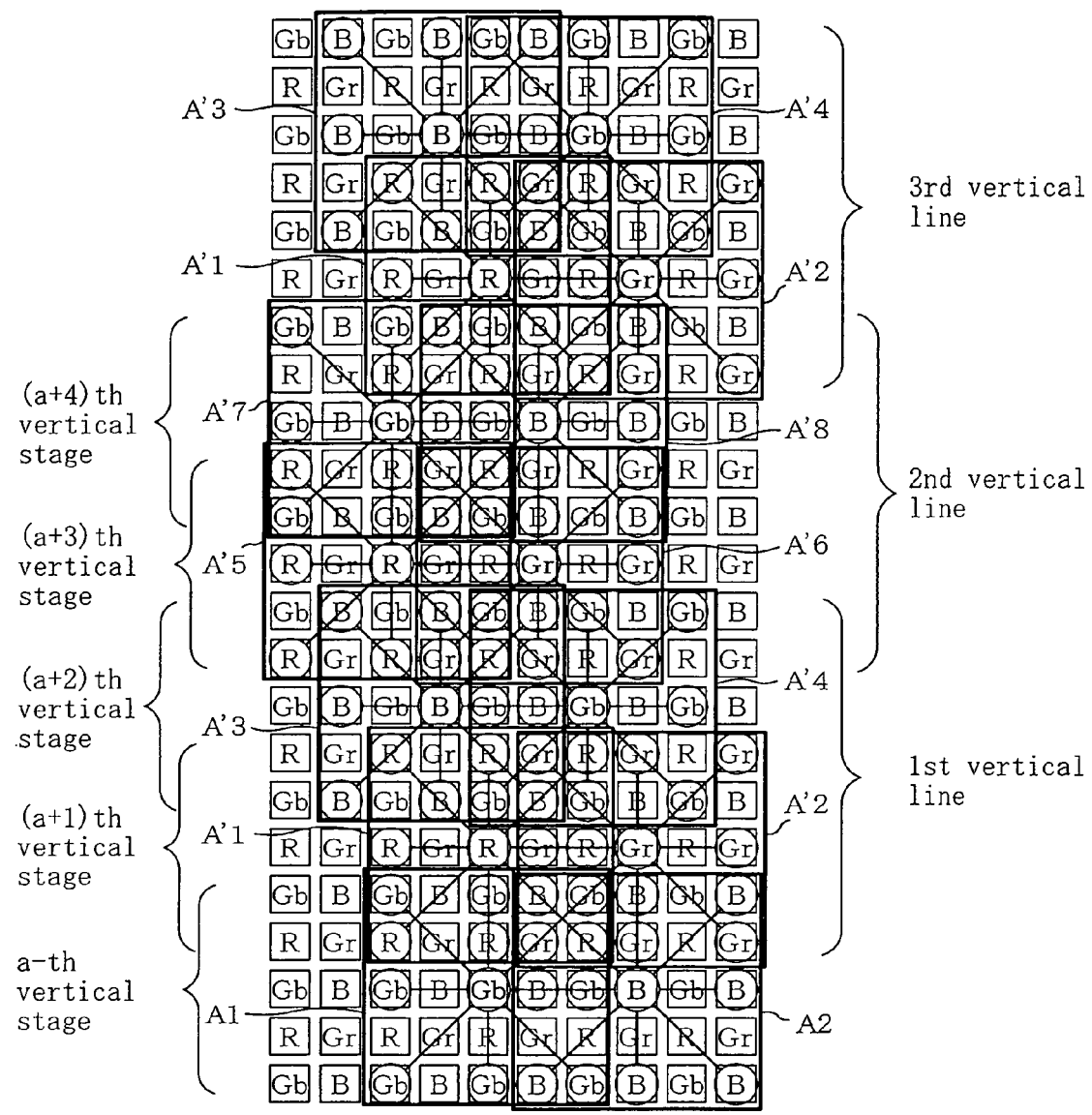
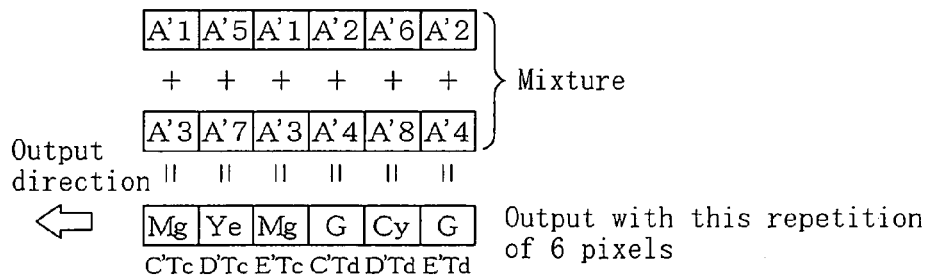

FIG. 7
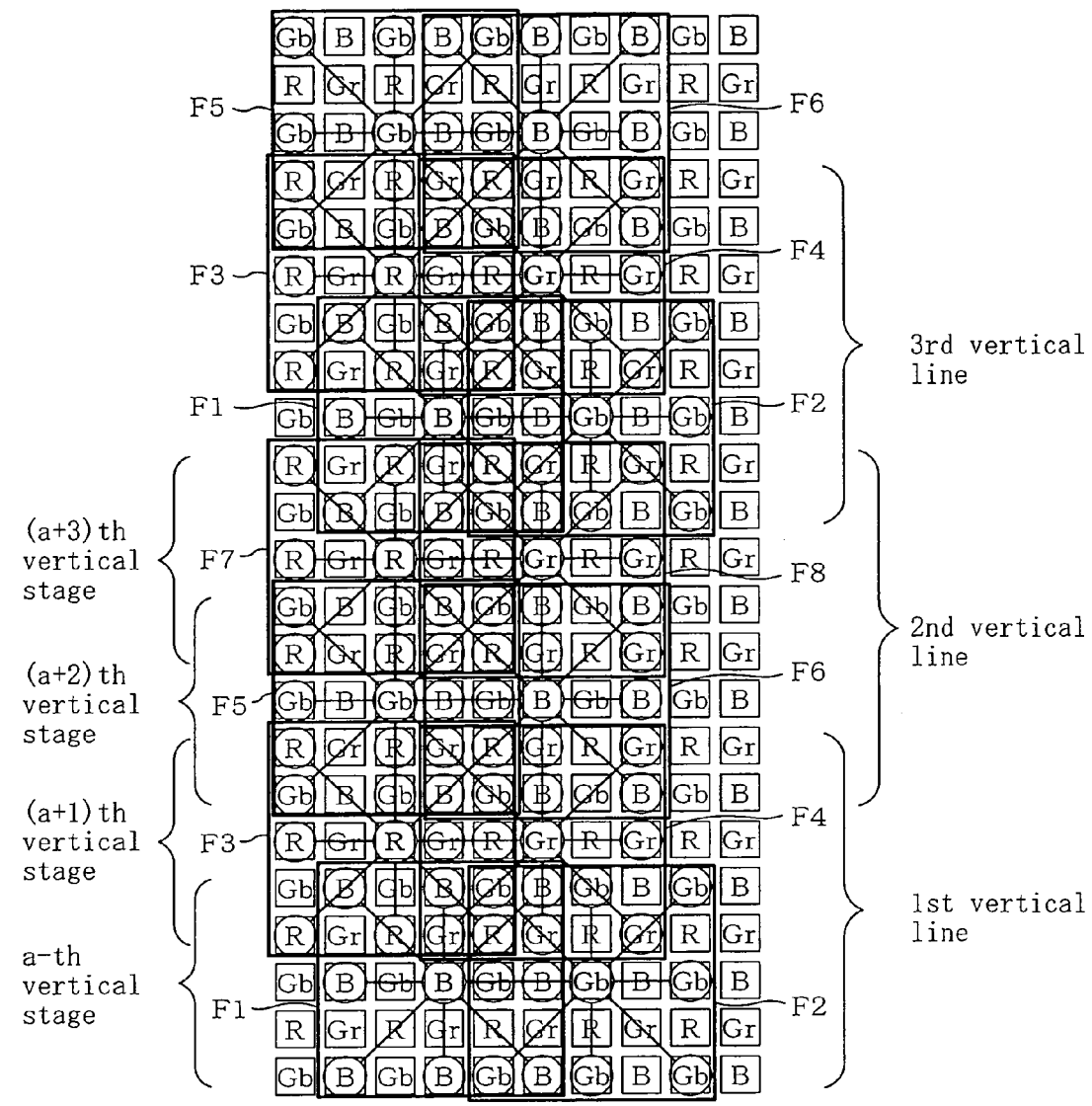
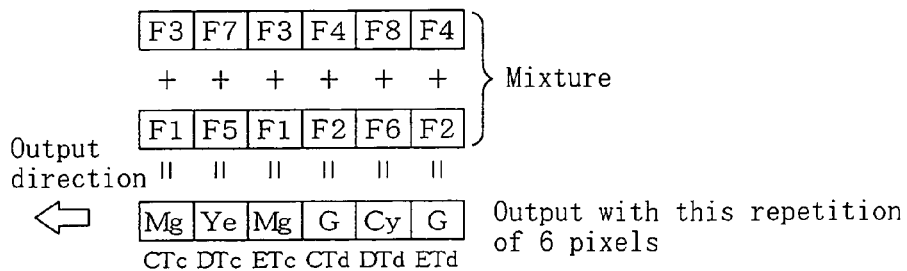

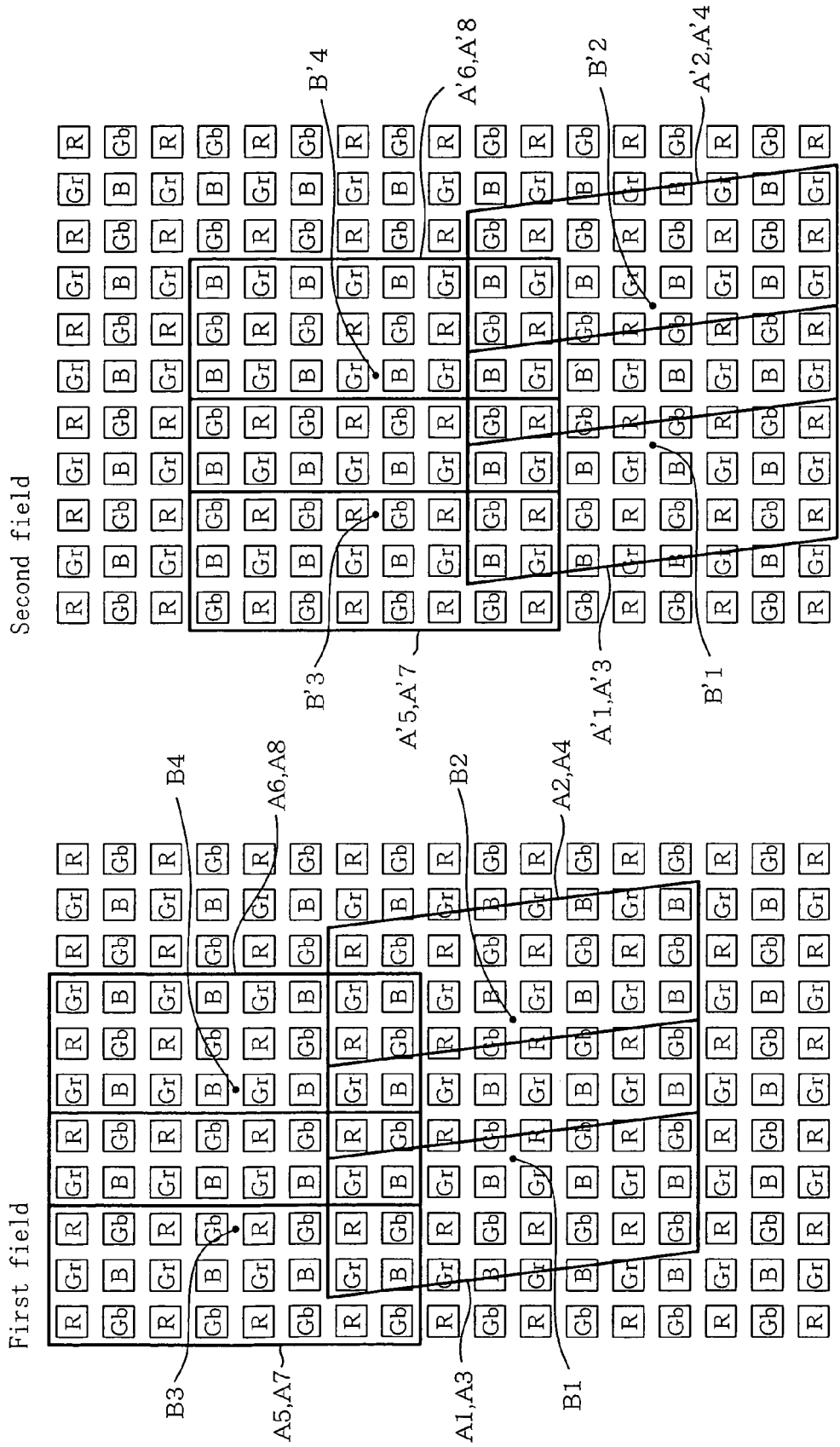

($\phi_{H1} = \phi_{H4}$, $\phi_{H2} = \phi_{H3}$)

($\phi_{H1} = \phi_{H4}$, $\phi_{H2} = \phi_{H3}$)

SOLID STATE IMAGING DEVICE AND DRIVING METHOD THEREOF

CROSS-REFERENCE TO RELATED APPLICATION

This application claims priority under 35 U.S.C. §119(a) on Japanese Patent Application No. 2004-13609 filed on Jan. 21, 2004, the entire contents disclosed in the claims, specification and drawings of this application are hereby incorporated by reference.

BACKGROUND OF THE INVENTION

The present invention relates to a solid state imaging device of a digital still camera, a digital video camera, and the like.

Conventionally, a solid state imaging element which converts received light to an electric signal and outputs the electric signal as a video signal has been known, and a camera which displays the video signal obtained from the solid state imaging element in the form of a static image, such as a digital still camera, or the like, has also been known. In recent years, further improvements of image quality and functions have been demanded in such a camera which uses a solid state imaging element, and the number of pixels has been rapidly increasing.

For example, a solid state imaging element having about 5,000,000 pixels has about 1,920 pixels in a column (vertical direction) and about 2,560 pixels in a row (horizontal direction). The number of pixels of this element, i.e., about 5,000,000, is about 16 times that of a generally-employed NTSC solid state imaging element. The frame rate for full pixel output is about a ½ second when a conventional pixel clock of about 12 MHz is used. Thus, the video signal output from the solid state imaging element cannot be output to a display device (a liquid crystal monitor, or the like) of the camera without modifying the original frame rate.

According to a driving method which has been conventionally employed in view of the above in such a solid state imaging element, the pixels from which signals are to be read are thinned along the horizontal direction while the speed of the pixel clock is increased, whereby a video signal of a moving picture is read with higher speed. For example, signals of pixels on two out of eight lines are used.

Further, a technique of reducing the number of output pixels of a solid state imaging element using a pixel mixture method has been known (see Japanese Unexamined Patent Publication No. 2001-36920).

However, in the above pixel thinning method, pixels are immoderately resampled in the vertical direction (¼ in the above example), and no associated spatial LPF used for this resampling in the vertical direction is not provided. Accordingly, in an image where a video signal contains high-frequency components in the vertical direction, a large amount of aliasing components deriving from the high-frequency components in the vertical direction occur in the low-frequency range. This causes not only a large number of false signals along with the generation of luminance signals and chromaticity signals but also a significant decrease in the vertical resolution with respect to the horizontal resolution due to an imbalance in pixel sampling density between the horizontal direction and the vertical direction. In addition, since signals of pixels on lines from which no data is to be read out are discarded, the substantial sensitivity decreases. In the above example, the percentage of effectively-used pixels is 25%.

In the case where the above-described conventional technique is used, all of the above problems become more serious in principle as the number of pixels of a solid state imaging element increases because it is necessary to decrease the ratio of columns to be read to all of the columns of the solid state imaging element for the purpose of increasing the frame rate.

SUMMARY OF THE INVENTION

The present invention was conceived to overcome the above problems. An objective of the present invention is to reduce the number of output pixel signals of a solid state imaging element having a large number of pixels, such as a super-megapixel imaging element, or the like, by a pixel addition method, such that moving picture imaging is realized with a super resolution solid image imaging element suitable for a system that operates based on interlaced scanning.

In order to achieve the above objective, the present invention includes a solid state imaging element and performs a pixel addition process of the first and second fields wherein the electric charges of a plurality of pixels included in a plurality of pixel mixture unit areas are added together to alternately output signals of the electric charges obtained in the pixel addition process of the first and second fields as signals for interlaced scanning.

Specifically, a solid state imaging device of the present invention comprises: a solid state imaging element including a plurality of photoelectric conversion elements arranged in a matrix, the solid state imaging element including pixels grouped into pixel mixture unit areas, each of which includes q pixels (q is a natural number equal to or greater than 2) in the first direction of the solid state imaging element and p pixels (p is a natural number equal to or greater than 2) in the second direction that crosses the first direction; pixel addition means for performing a first-field pixel addition process of adding together electric charges of a plurality of pixels included in the plurality of pixel mixture unit areas and a second-field pixel addition process of adding together the electric charges of the plurality of pixels included in the plurality of pixel mixture unit areas based on a combination of the pixel mixture unit areas which is different from that of the first-field pixel addition process; and output means for alternately outputting signals of the electric charges obtained in the first-field pixel addition process and second-field pixel addition process as signals for interlaced scanning.

According to the solid state imaging device of the present invention, a video signal can be read with high speed without thinning pixels to be read. Therefore, signals of all the pixels can be output without abandonment and, accordingly, the sensitivity of the imaging element is greatly improved. Further, aliasing components derived from high frequency components in a low frequency range are greatly reduced. Therefore, false signals are greatly suppressed in both the brightness signal and chromaticity signal. As a result, the image quality improves.

In the solid state imaging device of the present invention, preferably, the number of pixels in the first direction in each of the pixel mixture unit areas, q, satisfies the relationship of $q=4m+1$ (m is a natural number), and the number of pixels in the second direction in each of the pixel mixture unit areas, p, satisfies the relationship of $p=4n+1$ (n is a natural number); and the pixel mixture unit areas overlap one another by $(q+1)/2$ pixels in the first direction and by $(p+1)/2$ pixels in the second direction.

Alternatively, the number of pixels in the first direction in each of the pixel mixture unit areas, q, may satisfy the relationship of $q=4m-1$ (m is a natural number), and the number of pixels in the second direction in each of the pixel mixture unit areas, p, may satisfy the relationship of p=4n−1 (n is a natural number); and the pixel mixture unit areas may repeatedly overlap one another alternately by (q−1)/2 pixels and (q+3)/2 pixels in the first direction and alternately by (p−1)/2 pixels and (p+3)/2 pixels in the second direction.

Electric charges of a plurality of pixels included in one pixel mixture unit area may be added together in the first direction; and the electric charges of the pixels which are added together respectively in the plurality of pixel mixture unit areas and transferred in the first direction may be added together in the second direction. With such a structure, the process of adding the electric charges of the pixel in the first direction and the process of adding the electric charges of the pixel in the second direction are clearly separated so that a time-series process can be quickly performed.

The pixel addition means may perform a plurality of line processes on two of the pixel mixture unit areas which are adjacent in the first direction wherein electric charges of the plurality of pixels included in the two pixel mixture unit areas are added together; and in at least one of the plurality of line processes, two of the pixel mixture unit areas which are shifted in the second direction by one or more pixels may be processed. With such a structure, the electric charges of pixels of different colors can readily be added together in the second direction.

The centroid position of a first region formed by two of the pixel mixture unit areas which are processed in one of the line processes is on a line that extends in the first direction and passes over the median point between the centroid position of a second region formed by two of the pixel mixture unit areas which are processed in another one of the line processes and the centroid position of a third region formed by two of the pixel mixture unit areas which is processed at the same time with the second region and is placed adjacent to the second region in the second direction. With such a structure, centroid correction of a pixel signal output from the solid state imaging device is readily achieved, and the frame lag in a moving picture can be reduced.

In the solid state imaging device of the present invention, preferably, the solid state imaging element includes a color filter provided over front faces of the photoelectric conversion elements. In this case, a color filter arrangement of the solid state imaging element may be a combination of Bayer arrangements of 2 rows×2 columns; the pixel addition means may include a first-direction transfer stage for adding together electric charges of the plurality of pixels in the first direction in each of the pixel mixture unit areas and a second-direction transfer stage for adding together the electric charges obtained by the addition in the first-direction transfer stage in the second direction; and the electric charges obtained by the addition in the second-direction transfer stage may be pixel signals for complementary color filter arrangement display. Alternatively, a color filter arrangement of the solid state imaging element may be a combination of four colors, cyan, yellow, green and magenta, arranged in 2 rows×2 columns.

In the solid state imaging device of the present invention, preferably, the pixel addition means includes a first-direction transfer stage and a second-direction transfer stage, the first-direction transfer stage including a plurality of CCDs which transfer the electric charges of the pixels in the first direction, the second-direction transfer stage including a plurality of CCDs which transfer the electric charges transferred from the first-direction transfer stage in the second direction. With such a structure, the process of adding together the electric charges of pixels with CCDs can be realized.

In this case, preferably, the second-direction transfer stage alternately includes a storage region which includes a first gate and retains an electric charge and a barrier region which includes a second gate and functions as a barrier against transfer of electric charges; and the first gate and the second gate are electrically separated to receive separate biases. With such a structure, the electric charges of the pixels in the second-direction transfer stage can be transferred not only in the forward direction but also in the reverse direction. Accordingly, the pixel addition process can be quickly performed.

A method of the present invention for driving a solid state imaging device which includes a solid state imaging element including a plurality of photoelectric conversion elements arranged in a matrix, the solid state imaging element including pixels grouped into pixel mixture unit areas, each of which includes q pixels (q is a natural number equal to or greater than 2) in the first direction of the solid state imaging element and p pixels (p is a natural number equal to or greater than 2) in the second direction that crosses the first direction, comprises the steps of: (a) adding together electric charges of pixels included in each of the pixel mixture unit areas and transferring the added electric charges in the first direction; (b) adding together electric charges of pixels from a plurality of pixel mixture unit areas while the electric charges added and transferred in the first direction at step (a) are transferred in the second direction; and (c) alternately outputting signals which relates to the electric charges added together at step (b) in first and second fields as signals for interlaced scanning.

According to the solid state imaging device driving method of the present invention, a video signal can be read with high speed without thinning pixels to be read. Therefore, signals of all the pixels can be output without abandonment and, accordingly, the sensitivity of the imaging element is greatly improved. Further, aliasing components derived from high frequency components in a low frequency range are greatly reduced. Therefore, false signals are greatly suppressed in both the brightness signal and chromaticity signal. As a result, the image quality improves.

In the solid state imaging device driving method of the present invention, preferably, the pixel mixture unit areas overlap one another in the first and second directions to constitute an arrangement which has a two-dimensional repetition.

In the solid state imaging device driving method of the present invention, preferably, at step (a), electric charges of pixels included in one pixel mixture unit area are added together in the first direction; and at step (b), the electric charges added together in the first direction at step (a) are added together in the second direction. Preferably, at step (b), a line process of adding together in the second direction electric charges of pixels of two pixel mixture unit areas which are adjacent in the first direction is performed over a plurality of stages.

In the solid state imaging device driving method of the present invention, preferably, the solid state imaging element includes a color filter provided over front faces of the photoelectric conversion elements. In this case, a color filter arrangement of the solid state imaging element may be a combination of Bayer arrangements of 2 rows×2 columns; and at step (b), electric charges of pixels having different colors in each of the pixel mixture unit areas may be added together to generate a pixel signal for a complementary color filter arrangement. Alternatively, a color filter arrangement of the solid state imaging element may be a combination of four colors, cyan, yellow, green and magenta, arranged in 2 rows×2 columns.

BRIEF DESCRIPTION OF THE DRAWINGS

FIG. 3 generally illustrates the pixel mixture in the first field according to embodiment 1.

FIG. 4 generally illustrates the pixel mixture in the second field according to embodiment 1.

FIG. 7 generally illustrates the pixel mixture in the first field according to embodiment 2.

FIG. 15A and FIG. 15B show the relationship of the centroid positions in the pixel mixture of the first vertical line and the second vertical line respectively for the first field and the second field in embodiment 1.

DESCRIPTION OF THE PREFERRED EMBODIMENTS

Hereinafter, examples of a color solid state imaging device of the present invention will be described with reference to the drawings. It should be noted that examples of a CCD solid state imaging element will be described in the following embodiments, but the solid state imaging element may be a MOS type solid state imaging element. Thus, in the following embodiments, "mixture of charges" means one of the operations of adding together the charges.

Embodiment 1

Figure 1:
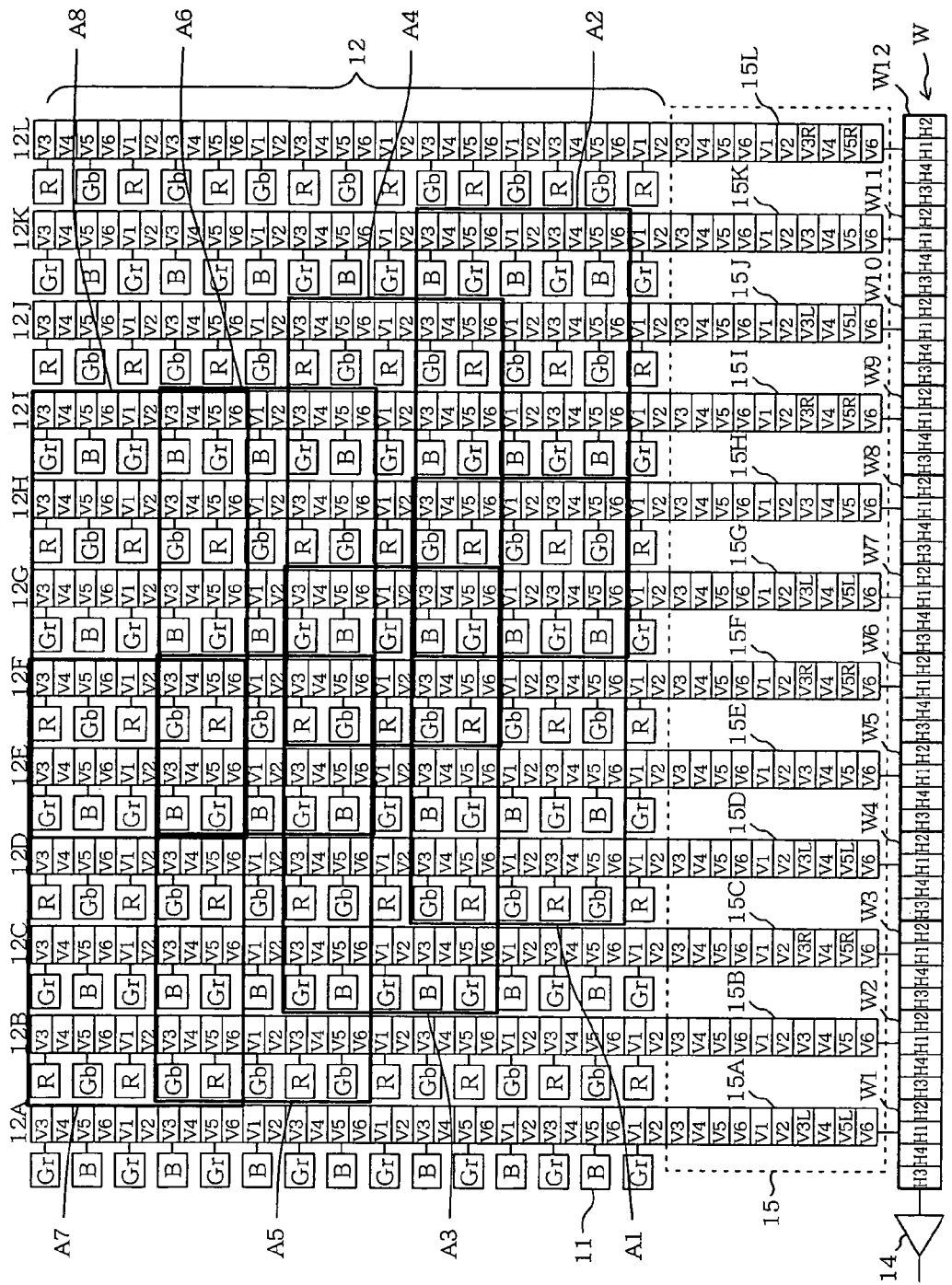
FIG. 1 is a plan view schematically showing an arrangement of components in a CCD solid state imaging element of a color solid state imaging device according to embodiment 1 of the present invention.

FIG. 1 is a plan view schematically showing an arrangement of components in a CCD solid state imaging element of a color solid state imaging device according to embodiment 1. The solid state imaging element of embodiment 1 includes a large number of pixels 11 arranged in a matrix along the vertical direction (first direction) and the horizontal direction (second direction). Each pixel 11 includes a photoelectric conversion element and a color filter attached over the front face of the photoelectric conversion element. The pixels 11 include B-pixels corresponding to blue filter regions (shown by "B" in FIG. 1), R-pixels corresponding to red filter regions (shown by "R" in FIG. 1), and Gr- and Gb-pixels corresponding to green filter regions (shown by "Gr" and "Gb" in FIG. 1). That is, the solid state imaging element of embodiment 1 has a primary color filter arrangement, especially, a Bayer arrangement structure. Although in actuality the Gr-pixels and Gb-pixels correspond to filter regions of the same color (green), a pixel horizontally sandwiched by R-pixels is shown as a Gr-pixel and a pixel horizontally sandwiched by B-pixels is shown as a Gb-pixel for convenience of illustration.

The solid state imaging device of embodiment 1 includes: a 6-phase vertical transfer stage (first-direction transfer stage) 12 (12A, 12B, . . . ) which is formed by connecting gates V1 to V6 in series; a horizontal transfer stage (second-direction transfer stage) W which is formed by connecting 4-phase transfer gate portions W1, W2, . . . , in series, each 4-phase transfer gate portion including gates H1, H2, H3 and H4; an output amplifier 14 for outputting electric charges accumulated in the horizontal transfer stage W; and a vertical-horizontal transfer linking portion 15 at the end stage of vertical transfer which has the gates capable of being independently driven (gates V3, V3R, V3L, V5, V5R, and V5L). The vertical transfer stage 12, the vertical-horizontal transfer linking portion 15, and the horizontal transfer stage W constitute means for performing a pixel mixture process for the first field and a pixel mixture process for the second field, which will be described later. Further, the output amplifier 14 functions as means for outputting a signal of a pixel which is obtained through the pixel mixture processes for the first and second fields as a signal for interlaced scanning.

Herein, the odd-numbered gates, e.g., gates V1, V3, . . . of the transfer stages 12A, 12B, . . . are each connected to a photoelectric conversion element of a corresponding pixel to read an electric charge from the pixel. The read electric charge is transferred by the gates V1 to V6.

The gates H1 and H3 of the transfer gate portions W1, W2, . . . in the horizontal transfer stage W has the function of retaining an electric charge transferred from the vertical-horizontal transfer linking portion 15. The gates H2 and H4 function as a barrier against the movement of the electric charge through the gates H1 and H3. Herein, as will be described later, the gates H1, H2, H3 and H4 of the transfer gate portions W1, W2, . . . in the horizontal transfer stage W are independently wired.

The pixels 11 arranged in a matrix are grouped into a large number of pixel mixture unit areas which overlap one another. In embodiment 1, the pixels 11 are grouped. into basic units A of pixel mixture areas, each of which is formed by 5×5 pixels. The color of a filter portion corresponding to a pixel at the center of each pixel mixture unit area A represents the mixed color in each pixel mixture unit area. In the example of embodiment 1, each pixel mixture unit area is 5 rows×5 columns.

As shown in FIG. 1, in embodiment 1, the pixel mixture unit areas of the first field include a pixel mixture unit area A1 of Gb, a pixel mixture unit area A2 of B, a pixel mixture unit area A3 of Gr, a pixel mixture unit area A4 of R, a pixel mixture unit area A5 of Gb, a pixel mixture unit area A6 of B, a pixel mixture unit area A7 of R, and a pixel mixture unit area A8 of Gr. In the specification of the present application, the term "pixel mixture unit area" is defined so as to include a unit area in which addition of electric charges in a MOS solid state imaging element is performed.

In the example described herein, neighboring pixel mixture unit areas overlap one another by two pixels both horizontally and vertically. Although not shown in FIG. 1, the pixel mixture unit areas A1 to A8 repeatedly occur while overlapping one another both vertically and horizontally.

[Pixel Mixture in First Field]

Figure 2:
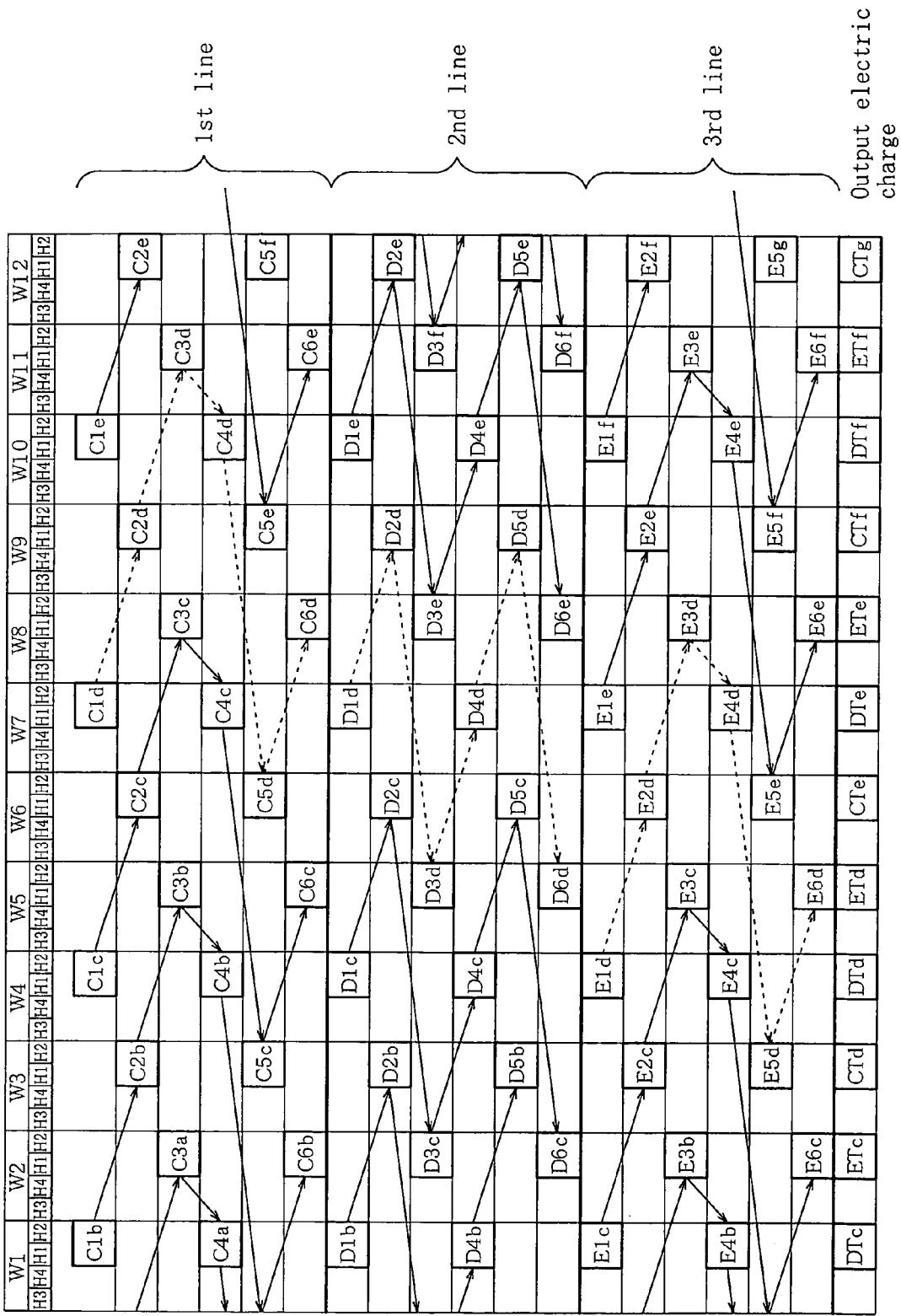
FIG. 2 illustrates the procedure of a pixel mixture process for the first field according to embodiment 1.

Next, the procedure of a pixel mixture process for the first field according to embodiment 1 is described with the example of FIG. 1, where pixels in each of the pixel mixture unit areas A1 to A8 are mixed, in conjunction with FIG. 2.

Process of Mixing Electric Charges of Pixels in Pixel Mixture Unit Area

At the first step, a read pulse is applied to the gate V3 of the vertical transfer stage 12, whereby electric charges are read from the uppermost row of each pixel mixture unit area. The electric charges are transferred to the gate V1. Then, a read pulse is applied to the gate V1, whereby electric charges are read from the center of the pixel mixture unit area. The read electric charges are mixed with the electric charges previously read from the uppermost row.

The mixed electric charges of the two pixels are transferred from the gate V1 to the gate V5. Then, a read pulse is applied to the gate V5, whereby electric charges of the three pixels are mixed.

Thus, the electric charges of the three pixels vertically aligned in the pixel mixture unit area are mixed as described above. In the example described herein, mixture of electric charges of the vertically-aligned three pixels is performed at the same time in the pixel mixture unit areas A1 to A8.

It should be noted that there are many methods for mixing electric charges of the vertically-aligned three pixels other than those described in embodiments 1 to 3. As a matter of course, any of the other methods may be used in the present invention.

The thus-mixed electric charges of the three pixels are vertically transferred on a sequential basis and accumulated in the gates of the vertical-horizontal transfer linking portion 15 that is placed between the vertical transfer stage 12 and the horizontal transfer stage W.

FIG. 2 illustrates the procedure of mixing electric charges from two pixel mixture unit areas on a line by line basis in the horizontal transfer stage W after the electric charges from the three pixels have been mixed in the vertical transfer stage 12 for each pixel mixture unit area and transferred to the horizontal transfer stage W in the first field. The output of one horizontal line corresponds to the outputs of the three vertical lines. Therefore, FIG. 2 illustrates the procedure of transferring the electric charges mixed in two pixel mixture areas on a three-vertical-line by three-vertical-line basis.

In FIG. 2, the horizontal axis represents the position of the transfer gate portions in the horizontal transfer stage W, and the vertical axis represents the time. Hereinafter, the pixel mixture process in each line is described with reference to FIG. 2. It should be noted that FIG. 2, and FIGS. 6 and 10 which will be described later, only show electric charges extracted from the vertical-horizontal transfer linking portion 15 to the horizontal transfer stage W. However, in the second and subsequent columns of each line, the electric charges transferred in the horizontal transfer stage W and the electric charges extracted from the vertical-horizontal transfer linking portion 15 to the horizontal transfer stage W are sequentially mixed.

In embodiment 1, the vertical transfer stage 12 and the vertical-horizontal transfer linking portion 15 are controlled by a common bias signal, whereas the vertical transfer stage 12 and the vertical-horizontal transfer linking portion 15 are separately controlled in embodiments 2 and 3.

In embodiment 1, although the mixture process of electric charges C1c to C6c, C1d to C6d, D1c to D6c, D1d to D6d, E1c to E6c, E1d to E6d is only described, the mixture process is also performed on the other electric charges, e.g., electric charges C1e to C6e, D1e to D6e, E1e to E6e, and the like, as shown in FIG. 2.

Process in First Line

At the first step, among the mixed electric charges from the vertically-aligned three pixels in each pixel mixture unit area which are retained in the gates of the vertical-horizontal transfer linking portion 15, electric charges mixed in the vertical transfer stages (15D and 15G) that include the independently-drivable gates V3L and V5L are extracted to the transfer gate portions W4 and W7 (each gate H1) and retained as electric charges C1c and C1d. Hereinafter, FIG. 2 only shows the electric charges extracted from the vertical transfer stages but, in actuality, the electric charges extracted from the vertical lines are sequentially mixed.

Then, electric charges C1c and C1d are transferred in the reverse direction (direction away from the output amplifier 14) by two stages (i.e., two stages of the transfer gate portions each consisting of the gates H1 to H4) and, thereafter, the electric charges mixed in the vertical transfer stages (15F and 15I) including the independently-drivable gates V3R and V5R are extracted to the transfer gate portions W6 and W9 and retained as electric charges C1c+C2c and C1d+C2d.

Electric charges C1c+C2c and C1d+C2d are transferred in the reverse direction by two stages, and then, electric charges mixed in the vertical transfer stages (15H and 15K) including the gates V3 and V5 are extracted to the transfer gate portions W8 and W11 and retained as electric charges C1c+C2c+C3c and C1d+C2d+C3d.

Electric charge C1c+C2c+C3c is the mixture of the electric charges from 9 Gb-pixels in the pixel mixture unit area A1. Electric charge C1d+C2d+C3d is the mixture of the electric charges from 9 B-pixels in the pixel mixture unit area A2.

Hereinafter, the subsequent steps of the mixture process on electric charges C1c+C2c+C3c and C1d+C2d+C3d are only described.

Electric charges C1c+C2c+C3c and C1d+C2d+C3d are transferred in the forward direction (direction toward the output amplifier 14) by one stage, and then, electric charges mixed in the vertical transfer stages (15G and 15J) including the independently-drivable gates V3L and V5L are extracted to the transfer gate portions W7 and W10 and retained as electric charges C1c+C2c+C3c+C4c and C1d+C2d+C3d+ C4d.

Electric charges C1c+C2c+C3c+C4c and C1d+C2d+C3d+ C4d are transferred in the forward direction by four stages, and then, electric charges mixed in the vertical transfer stages (15C and 15F) including the independently-drivable gates V3R and V5R are extracted to the transfer gate portions W3 and W6 and retained as electric charges C1c+C2c+C3c+ C4c+C5c and C1d+C2d+C3d+C4d+C5d.

Electric charges C1c+C2c+C3c+C4c+C5c and C1d+C2d+ C3d+C4d+C5d are transferred in the reverse direction by two stages, and then, electric charges mixed in the vertical transfer stages (15E and 15H) including the gates V3 and V5 are extracted to the transfer gate portions W5 and W8 and retained as electric charges C1c+C2c+C3c+C4c+C5c+C6c and C1d+C2d+C3d+C4d+C5d+C6d.

Electric charge C4c+C5c+C6c is the mixture of the electric charges from 9 Gr-pixels in the pixel mixture unit area A3. Electric charge C1c+C2c+C3c+C4c+C5c+C6c is the mixture of the electric charges from 18 pixels in the pixel mixture unit areas A1 and A3, which is output as electric charge CTc. Electric charge C4d+C5d+C6d is the mixture of the electric charges from 9 R-pixels in the pixel mixture unit area A4. Electric charge C1d+C2d+C3d+C4d+C5d+C6d is the mixture of the electric charges from 18 pixels in the pixel mixture unit areas A2 and A4, which is output as electric charge CTd.

Process in Second Line

At the first step, output electric charges CTc and CTd generated in the electric charge mixing process for the first line are transferred in the forward direction by two stages and retained in the transfer gate portions W3 and W6. Thereafter, among the mixed electric charges from the vertically-aligned three pixels in each pixel mixture unit area which are retained in the gates of the vertical-horizontal transfer linking portion 15, electric charges mixed in the vertical transfer stages (15D and 15G) that include the independently-drivable gates V3L and V5L are extracted to the transfer gate portions W4 and W7 (each gate H1) and retained as electric charges D1c and D1d.

Thereafter, output electric charges CTc and CTd generated in the process in the first line are transferred together with electric charges which are sequentially mixed and transferred in the electric charge mixture process in the second line.

Then, electric charges D1c and D1d are transferred in the reverse direction by two stages and, thereafter, the electric charges mixed in the vertical transfer stages (15F and 15I) including the independently-drivable gates V3R and V5R are extracted to the transfer gate portions W6 and W9 and retained as electric charges D1c+D2c and D1d+D2d.

Electric charges D1c+D2c and D1d+D2d are transferred in the forward direction by four stages, and then, electric charges mixed in the vertical transfer stages (15B and 15E) including the gates V3 and V5 are extracted to the transfer gate portions W2 and W5 and retained as electric charges D1c+D2c+D3c and D1d+D2d+D3d.

Electric charge D1c+D2c+D3c is the mixture of the electric charges from 9 Gb-pixels in the pixel mixture unit area A5. Electric charge D1d+D2d+D3d is the mixture of the electric charges from 9 B-pixels in the pixel mixture unit area A6. Hereinafter, the subsequent steps of the mixture process on electric charges D1c+D2c+D3c and D1d+D2d+D3d are only described.

Electric charges D1c+D2c+D3c and D1d+D2d+D3d are transferred in the reverse direction by two stages, and then, electric charges mixed in the vertical transfer stages (15D and 15G) including the independently-drivable gates V3L and V5L are extracted to the transfer gate portions W4 and W7 and retained as electric charges D1c+D2c+D3c+D4c and D1d+D2d+D3d+D4d.

Electric charges D1c+D2c+D3c+D4c and D1d+D2d+ D3d+D4d are transferred in the reverse direction by two stages, and then, electric charges mixed in the vertical transfer stages (15F and 15I) including the independently-drivable gates V3R and V5R are extracted to the transfer gate portions W6 and W9 and retained as electric charges D1c+D2c+D3c+ D4c+D5c and D1d+D2d+D3d+D4d+D5d.

Electric charges D1c+D2c+D3c+D4c+D5c and D1d+ D2d+D3d+D4d+D5d are transferred in the forward direction by four stages, and then, electric charges mixed in the vertical transfer stages (15B and 15E) including the gates V3 and V5 are extracted to the transfer gate portions W2 and W5 and retained as electric charges D1c+D2c+D3c+D4c+D5c+D6c and D1d+D2d+D3d+D4d+D5d+D6d.

Electric charge D4c+D5c+D6c is the mixture of the electric charges from 9 R-pixels in the pixel mixture unit area A7. Electric charge D1c+D2c+D3c+D4c+D5c+D6c is the mixture of the electric charges from 18 pixels in the pixel mixture unit areas A5 and A7, which is output as electric charge DTc. Electric charge D4d+D5d+D6d is the mixture of the electric charges from 9 Gr-pixels in the pixel mixture unit area A8. Electric charge D1d+D2d+D3d+D4d+D5d+D6d is the mixture of the electric charges from 18 pixels in the pixel mixture unit areas A6 and A8, which is output as electric charge DTd. Output electric charges CTc and CTd generated in the electric charge mixing process for the first line are retained at positions shifted in the forward direction by one stage from the positions where output electric charges DTc and DTd generated in the electric charge mixing process for the second line are retained.

Process in Third Line

At the first step, output electric charges CTc, CTd, DTc and DTd generated in the electric charge mixing process for the first and second lines are transferred in the forward direction by two stages and retained in the transfer gate portions W-1 (not shown in FIG. 2: present at a position shifted by two stages in the forward direction from the transfer gate portion W1), W2, W0 (not shown in FIG. 2: present at a position shifted by one stage in the forward direction from the transfer gate portion W1) and W3. Thereafter, among the mixed electric charges from the vertically-aligned three pixels in each pixel mixture unit area which are retained in the gates of the vertical-horizontal transfer linking portion 15, electric charges mixed in the vertical transfer stages (15A and 15D) that include the independently-drivable gates V3L and V5L are extracted to the transfer gate portions W1 and W4 (each gate HI) and retained as electric charges E1c and E1d.

Thereafter, output electric charges CTc, CTd, DTc and DTd generated in the electric charge mixing process for the first and second lines are transferred together with electric charges which are sequentially mixed and transferred in the electric charge mixture process in the third line.

Then, electric charges E1c and E1d are transferred in the reverse direction by two stages and, thereafter, the electric charges mixed in the vertical transfer stages (15C and 15F) including the independently-drivable gates V3R and V5R are extracted to the transfer gate portions W3 and W6 and retained as electric charges E1c+E2c and E1d+E2d.

Electric charges E1c+E2c and E1d+E2d are transferred in the forward direction by two stages, and then, electric charges mixed in the vertical transfer stages (15E and 15H) including the gates V3 and V5 are extracted to the transfer gate portions W5 and W8 and retained as electric charges E1c+E2c+E3c and E1d+E2d+E3d.

Electric charge E1c+E2c+E3c is the mixture of the electric charges from 9 Gb-pixels in the pixel mixture unit area A1. Electric charge E1d+E2d+E3d is the mixture of the electric charges from 9 B-pixels in the pixel mixture unit area A2. Hereinafter, the subsequent steps of the mixture process on electric charges E1c+E2c+E3c and E1d+E2d+E3d are only described.

Electric charges E1c+E2c+E3c and E1d+E2d+E3d are transferred in the forward direction by one stage, and then, electric charges mixed in the vertical transfer stages (15D and 15G) including the independently-drivable gates V3L and V5L are extracted to the transfer gate portions W4 and W7 and retained as electric charges E1c+E2c+E3c+E4c and E1d+E2d+E3d+E4d.

Electric charges E1c+E2c+E3c+E4c and E1d+E2d+E3d+E4d are transferred in the forward direction by four stages, and then, electric charges mixed in the vertical transfer stages (15X (not shown in FIG. 2: neighboring stage of the vertical transfer stage 15A at the forward direction side) and 15C) including the independently-drivable gates V3R and V5R are extracted to the transfer gate portions W0 (not shown in FIG. 2: neighboring transfer gate portion of the transfer gate portion W1 at the forward direction side) and W3 and retained as electric charges E1c+E2c+E3c+E4c+E5c and E1d+E2d+E3d+E4d+E5d.

Electric charges E1c+E2c+E3c+E4c+E5c and E1d+E2d+E3d+E4d+E5d are transferred in the reverse direction by two stages, and then, electric charges mixed in the vertical transfer stages (15B and 15E) including the independently-drivable gates V3 and V5 are extracted to the transfer gate portions W2 and W5 and retained as electric charges E1c+E2c+E3c+E4c+E5c+E6c and E1d+E2d+E3d+E4d+E5d+E6d.

Electric charge E4c+E5c+E6c is the mixture of the electric charges from 9 Gr-pixels in the pixel mixture unit area A3. Electric charge E1c+E2c+E3c+E4c+E5c+E6c is the mixture of the electric charges from 18 pixels in the pixel mixture unit areas A1 and A3, which is output as electric charge ETc. Electric charge E4c+E5c+E6c is the mixture of the electric charges from 9 R-pixels in the pixel mixture unit area A4. Electric charge E1c+E2c+E3c+E4c+E5c+E6c is the mixture of the electric charges from 18 pixels in the pixel mixture unit areas A2 and A4, which is output as electric charge ETd.

At the time when the process in the third line is completed, electric charges CTc (placed in the transfer gate portion W0 but not shown in FIG. 2), DTc, ETc, CTd, DTd, ETc, CTd, DTd, ETd, CTe, DTe, ETe, CTf, DTf, ETf . . . are retained in the transfer gate portions W0 (not shown in FIG. 2: neighboring transfer gate portion of the transfer gate portion W1 at the forward direction side), W1, W2, W3, W4, W5, W6, W7, W8, W9, W10, W11, W12 . . . of the horizontal transfer stage W. The electric charges are sequentially output from the output amplifier 14 to the outside. Output electric charge CTc is converted to an electric charge of a G-pixel of complementary color filter arrangement display by mixture of an electric charge of a Gb-pixel and an electric charge of a Gr-pixel of primary color filter arrangement display. Output electric charge DTc is converted to an electric charge of a Ye-pixel of complementary color filter arrangement display by mixture of an electric charge of a Gb-pixel and an electric charge of a R-pixel of primary color filter arrangement display. Output electric charge ETc is converted to an electric charge of a G-pixel of complementary color filter arrangement display by mixture of an electric charge of a Gb-pixel and an electric charge of a Gr-pixel of primary color filter arrangement display. Output electric charge CTd is converted to an electric charge of a Mg-pixel of complementary color filter arrangement display by mixture of an electric charge of a B-pixel and an electric charge of a R-pixel of primary color filter arrangement display. Output electric charge DTd is converted to an electric charge of a Cy-pixel of complementary color filter arrangement display by mixture of an electric charge of a B-pixel and an electric charge of a Gr-pixel of primary color filter arrangement display. Output electric charge ETd is converted to an electric charge of a Mg-pixel of complementary color filter arrangement display by mixture of an electric charge of a B-pixel and an electric charge of a R-pixel of primary color filter arrangement display.

In the above process of mixing electric charges of pixels, a feature of embodiment 1 resides in that electric charges are transferred not only in the forward direction but also in the reverse direction in the horizontal transfer stage W. Thus, as will be described later in detail, in embodiment 1, gate bias wires of the gates H1 to H4 which are charge transfer devices (e.g., CCD) placed in the horizontal transfer stage are separate from each other.

FIG. 3 illustrates a general procedure of pixel mixture in the first field shown in FIGS. 1 and 2. In FIG. 3, only a color filter pattern is shown while illustration of gates is omitted.

As apparent from FIG. 3 and the descriptions provided above, in the process on the first line and third line of the first field, all of the electric charges of Gb-pixels in the pixel mixture unit area A1 (9 Gb-pixels) and all of the electric charges of Gr-pixels in the pixel mixture unit area A3 (9 Gr-pixels) are mixed to generate an electric charge of a G-pixel used in complementary color filter arrangement display (output electric charges CTc and ETc). Meanwhile, all of the electric charges of B-pixels in the pixel mixture unit area A2 (9 B-pixels) and all of the electric charges of R-pixels in the pixel mixture unit area A4 (9 R-pixels) are mixed to generate an electric charge of a Mg-pixel used in complementary color filter arrangement display (output electric charges CTd and ETd).

In the process on the second line of the first field, all of the electric charges of Gb-pixels in the pixel mixture unit area A5 (9 Gb-pixels) and all of the electric charges of R-pixels in the pixel mixture unit area A7 (9 R-pixels) are mixed to generate an electric charge of a Ye-pixel used in complementary color filter arrangement display (output electric charge DTc). Meanwhile, all of the electric charges of B-pixels in the pixel mixture unit area A6 (9 B-pixels) and all of the electric charges of Gr-pixels in the pixel mixture unit area A8 (9 Gr-pixels) are mixed to generate an electric charge of a Cy-pixel used in complementary color filter arrangement display (output electric charge DTd).

Then, output electric charge CTc of a G-pixel, output electric charge DTc of a Ye-pixel, output electric charge ETc of a G-pixel, output electric charge CTd of a Mg-pixel, output electric charge DTd of a Cy-pixel, and output electric charge ETd of a Mg-pixel are sequentially output.

It should be noted that, also in the pixel mixture process in the first field, the order of charge transfer in the horizontal transfer stage W is not limited to the above, but other examples of the order are possible, and any of them may be used herein instead.

[Pixel Mixture in Second Field]

Next, pixel mixture for the second field is described. Herein, the drawings corresponding to FIGS. 1 and 2 are omitted. FIG. 4 illustrates a general procedure of pixel mixture in the second field. In FIG. 4, only a color filter pattern is shown while illustration of gates is omitted.

As shown in FIG. 4, pixel mixture unit areas A'1, A'2, A'3, A'4, A'5, A'6, A'7 and A'8 in the second field are placed at positions shifted upward by three pixels from pixel mixture unit areas A1, A2, A3, A4, A5, A6, A7 and A8, respectively.

The procedure of extracting electric charges of pixels from the pixel mixture unit areas A'1, A'2, A'3, A'4, A'5, A'6, A'7 and A'8 to the vertical transfer stages and performing 3-pixel mixture is the same as that described above as to the first field. The procedure of mixing electric charges in the horizontal transfer stage W is basically the same as that described with FIG. 2. In the last step, 6 electric charges generated by mixture in the first to third lines are output from the output amplifier.

In the process on the first line, the electric charges of R-pixels in the pixel mixture unit area A'1 (9 R-pixels) and the electric charges of B-pixels in the pixel mixture unit area A'3 (9 B-pixels) are mixed to generate electric charge C'Tc of a Mg-pixel in complementary color filter arrangement display. Meanwhile, the electric charges of Gr-pixels in the pixel mixture unit area A'2 (9 Gr-pixels) and the electric charge C'Td of Gb-pixels in the pixel mixture unit area A'4 (9 Gb-pixels) are mixed to generate electric charge of a G-pixel used in complementary color filter arrangement display.

In the process on the second line, the electric charges of R-pixels in the pixel mixture unit area A'5 (9 R-pixels) and the electric charges of Gb-pixels in the pixel mixture unit area A'7 (9 Gb-pixels) are mixed to generate electric charge D'Tc of a Ye-pixel in complementary color filter arrangement display. Meanwhile, the electric charges of Gr-pixels in the pixel mixture unit area A'6 (9 Gr-pixels) and the electric charges of B-pixels in the pixel mixture unit area A8 (9 B-pixels) are mixed to generate an electric charge D'Td of a Cy-pixel used in complementary color filter arrangement display.

In the process on the third line, the electric charges of R-pixels in the pixel mixture unit area A'1 (9 R-pixels) and the electric charges of B-pixels in the pixel mixture unit area A'3 (9 B-pixels) are mixed to generate electric charge E'Tc of a Mg-pixel in complementary color filter arrangement display. Meanwhile, the electric charges of Gr-pixels in the pixel mixture unit area A'2 (9 Gr-pixels) and the electric charges of Gb-pixels in the pixel mixture unit area A'4 (9 Gb-pixels) are mixed to generate an electric charge E'Td of a G-pixel in complementary color filter arrangement display.

After electric charges CTc, DTc, ETc, CTd, DTd and ETd generated in the pixel mixture process in the first field are sequentially output to the outside, output electric charge C'Tc of a Mg-pixel, output electric charge D'Tc of a Ye-pixel, output electric charge E'Tc of a Mg-pixel, output electric charge C'Td of a G-pixel, output electric charge D'Td of a Cy-pixel, and output electric charge E'Td of a G-pixel are sequentially output to the outside. That is, the electric charges of the pixels of the first field and the electric charges of the pixels of the second field are transferred from the output amplifier 14 to the outside based on an interlaced scanning format.

In embodiment 1 and embodiments 2 and 3 described later, all of the electric charges from the pixels are mixed in each of the pixel mixture process for the first field and the pixel mixture process for the second field. That is, the pixel use rate is 100% in any of the pixel mixture process for the first field and the pixel mixture process for the second field. It should be noted, however, that the effects described below can be achieved even if the pixel use rate is not 100% in the pixel mixture process for the first field or the pixel mixture process for the second field.

In the solid state imaging device of embodiment 1, the pixel use rate is 100% in both the pixel mixture process for the first field and the pixel mixture process for the second field, and therefore, a moving picture with a small frame lag can be obtained with no increase in the amount of electric charges of pixels. As a result, a moving picture suitable to various systems based on the interlaced scanning format can be output.

In a general solid state imaging device, a sill image is subjected to a normal process and displayed based on a primary color filter arrangement (Bayer arrangement), and only a moving picture is subjected to the pixel mixture process of embodiment 1 or embodiment 2 which will be described later.

Embodiment 2

Figure 5:
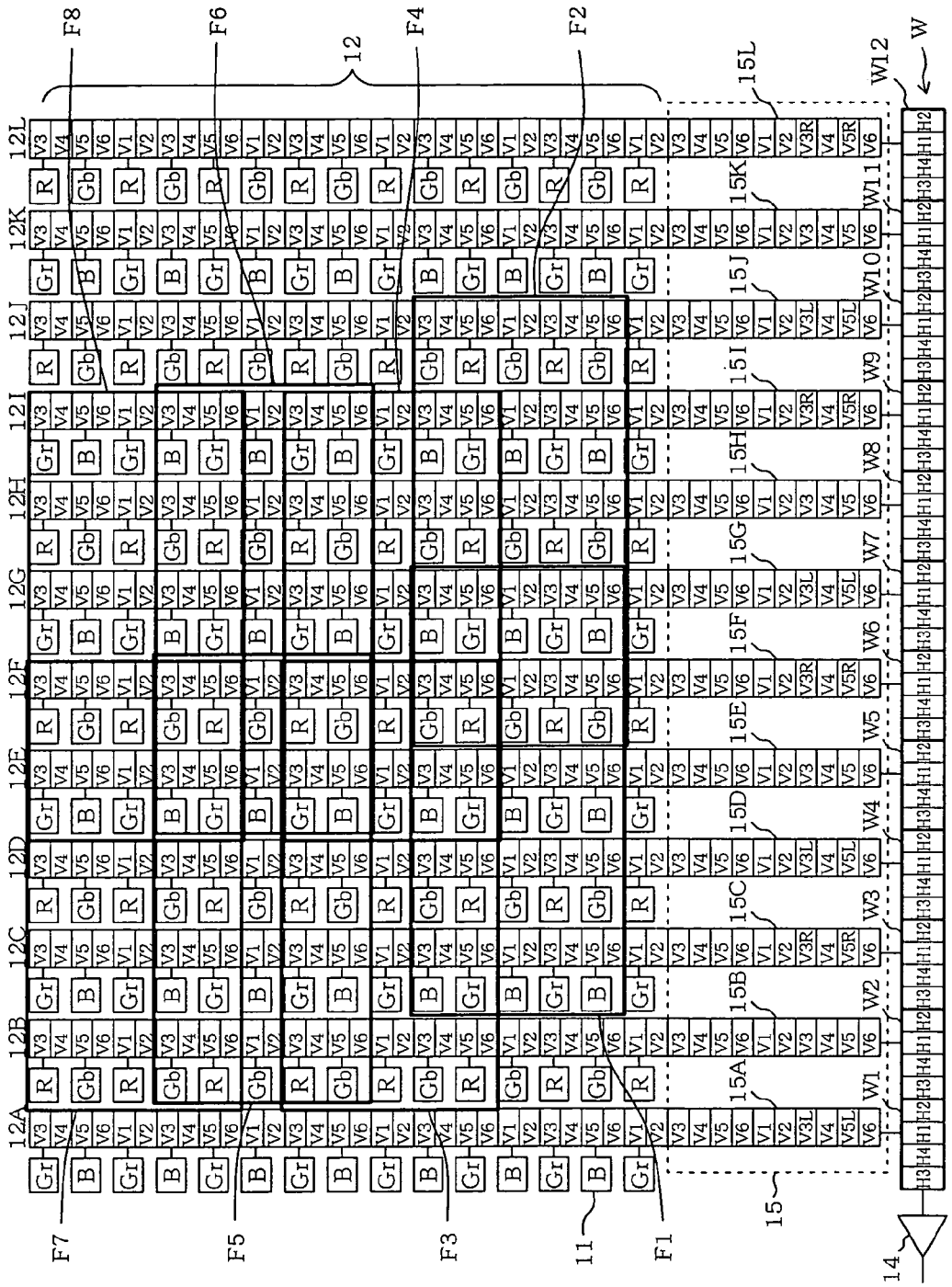
FIG. 5 is a plan view schematically showing an arrangement of components in a CCD solid state imaging element of a color solid state imaging device according to embodiment 2 of the present invention.

FIG. 5 is a plan view schematically showing an arrangement of components in a CCD solid stage imaging element of a color solid state imaging device according to embodiment 2. The structure of the solid state imaging element is the same as that described in embodiment 1.

As shown in FIG. 5, the pixels 11 arranged in a matrix are grouped into pixel mixture unit areas according to the method for processing captured image data. In embodiment 1, the pixels 11 are grouped into basic units F of pixel mixture areas, each of which is formed by 5×5 pixels. The color of a filter portion corresponding to a pixel at the center of each pixel mixture unit area F represents the mixed color in each pixel mixture unit area. In the example of embodiment 2, each pixel mixture unit area is 5 rows×5 columns.

In embodiment 2, the pixel mixture unit areas of the first field include a pixel mixture unit area F1 of B, a pixel mixture unit area F2 of Gb, a pixel mixture unit area F3 of R, a pixel mixture unit area F4 of Gr, a pixel mixture unit area F5 of Gb, a pixel mixture unit area F6 of B, a pixel mixture unit area F7 of R, and a pixel mixture unit area F8 of Gr.

In the example described herein, neighboring pixel mixture unit areas overlap one another by two pixels both horizontally and vertically. Although not shown in FIG. 5, the pixel mixture unit areas F1 to F8 repeatedly occur while overlapping one another both vertically and horizontally.

In embodiment 2, the structures of vertical transfer stages 12 (12A, 12B, ...) and the horizontal transfer stage W are the same as those described in embodiment 1. It should be noted, however, that the vertical transfer stages 12 and the vertical-horizontal transfer linking portions 15 are separately controlled in embodiment 2.

[Pixel Mixture in First Field]

In embodiment 2, a method which is basically the same as that described in embodiment 1 is used to extract electric charges of the pixels of the pixel mixture unit areas F1 to F8 to the gates of the vertical transfer stages, downwardly transfer the extracted electric charges, and mix the electric charges on a three-pixel by three-pixel basis, only except that different numbers are assigned to the vertical transfer stages from which the electric charges of the pixels of the pixel mixture unit areas F1 to F8 are extracted. Resultant mixed electric charges are transferred to the vertical-horizontal transfer linking portion 15. The procedures of the transfer and mixture are the same as those described in embodiment 1, and therefore, the descriptions thereof are herein omitted.

Figure 6:
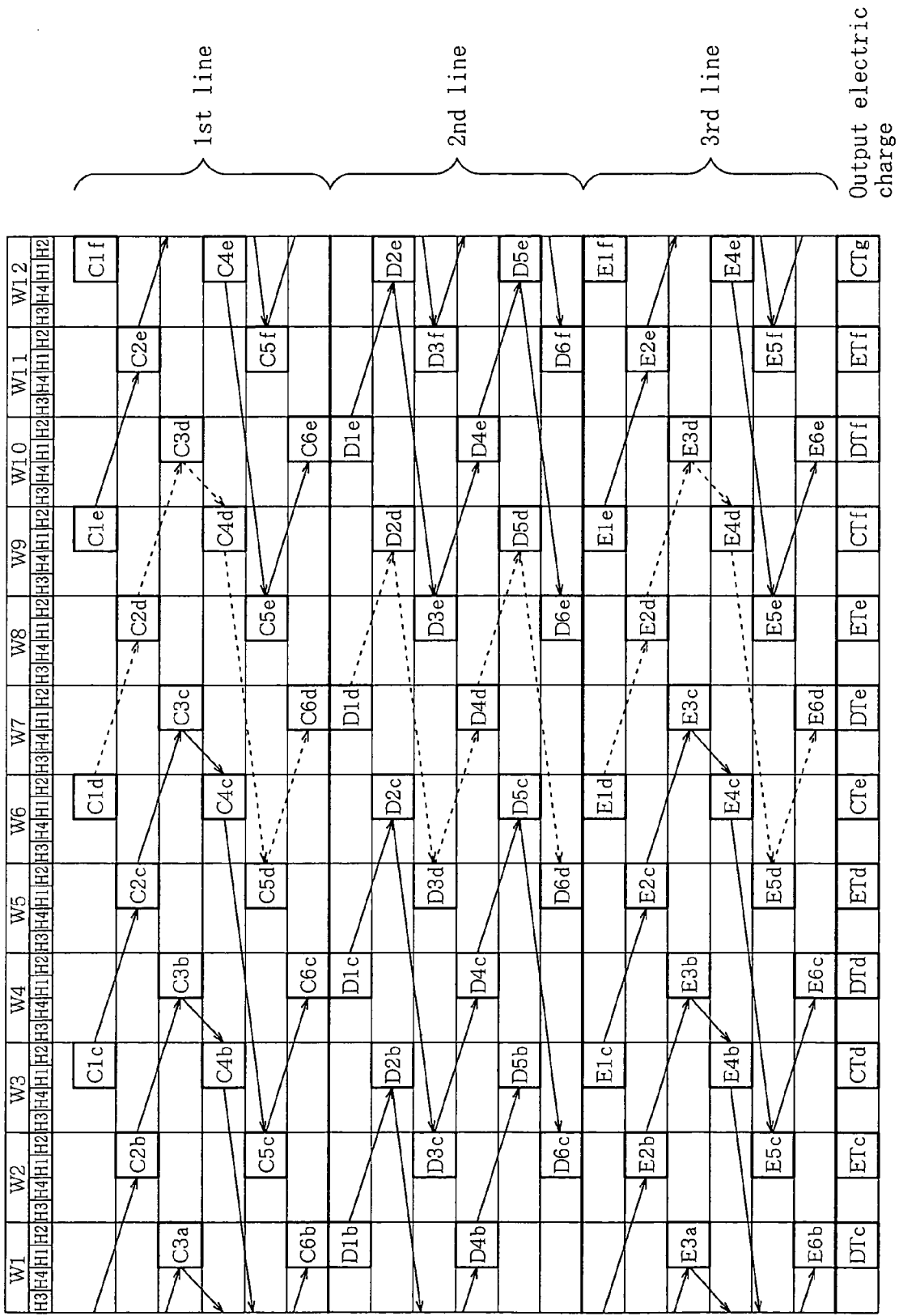
FIG. 6 illustrates the procedure of a pixel mixture process for the first field according to embodiment 2.

FIG. 6 illustrates the procedure of mixing electric charges within 8 pixel mixture unit areas in the first field. In FIG. 6, the horizontal axis represents the position of the transfer gate portions in the horizontal transfer stage W, and the vertical axis represents the time.

In embodiment 2, only the processes of mixing electric charges C1$c$ to C6$c$, C1$d$ to C6$d$, D1$c$ to D6$c$, D1$d$ to D6$d$, E1$c$ to E6$c$, and E1$d$ to E6$d$ are described. However, in actuality, the other electric charges, e.g., electric charges C1$e$ to C6$e$, D1$e$ to D6$e$, E1$e$ to E6$e$, are also mixed through the same procedure as shown in FIG. 6.

Process in First Line

At the first step, among the mixed electric charges from the vertically-aligned three pixels in each pixel mixture unit area which are retained in the gates of the vertical-horizontal transfer linking portion 15, electric charges mixed in the vertical transfer stages (15D and 15G) that include the independently-drivable gates V3R and V5R are extracted to the transfer gate portions W3 and W6 (each gate H1) and retained as electric charges C1$c$ and C1$d$. Hereinafter, FIG. 6 only shows the electric charges extracted from the vertical transfer stages but, in actuality, the electric charges extracted from the vertical lines are sequentially mixed.

Then, electric charges C1$c$ and C1$d$ are transferred in the reverse direction by two stages (i.e., two stages of the transfer gate portions each consisting of the gates H1 to H4) and, thereafter, the electric charges mixed in the vertical transfer stages (15E and 15H) including the independently-drivable gates V3 and V5 are extracted to the transfer gate portions W5 and W8 and retained as electric charges C1$c$+C2$c$ and C1$d$+C2$d$.

Electric charges C1$c$+C2$c$ and C1$d$+C2$d$ are transferred in the reverse direction by two stages, and then, electric charges mixed in the vertical transfer stages (15H and 15K) including the independently-drivable gates V3L and V5L are extracted to the transfer gate portions W7 and W10 and retained as electric charges C1$c$+C2$c$+C3$c$ and C1$d$+C2$d$+C3 d.

Electric charge C1$c$+C2$c$+C3$c$ is the mixture of the electric charges from 9 B-pixels in the pixel mixture unit area F1. Electric charge C1$d$+C2$d$+C3$d$ is the mixture of the electric charges from 9 Gb-pixels in the pixel mixture unit area F2. Hereinafter, the subsequent steps of the mixture process on electric charges C1$c$+C2$c$+C3$c$ and C1$d$+C2$d$+C3$d$ are only described.

Electric charges C1$c$+C2$c$+C3$c$ and C1$d$+C2$d$+C3$d$ are transferred in the forward direction by one stage, and then, electric charges mixed in the vertical transfer stages (15F and 15I) including the independently-drivable gates V3R and V5R are extracted to the transfer gate portions W6 and W9 and retained as electric charges C1$c$+C2$c$+C3$c$+C4$c$ and C1$d$+C2$d$+C3$d$+C4$d$.

Electric charges C1$c$+C2$c$+C3$c$+C4$c$ and C1$d$+C2$d$+C3$d$+C4$d$ are transferred in the forward direction by four stages, and then, electric charges mixed in the vertical transfer stages (15B and 15E) including the independently-drivable gates V3 and V5 are extracted to the transfer gate portions W2 and W5 and retained as electric charges C1$c$+C2$c$+C3$c$+C4$c$+C5$c$ and C1$d$+C2$d$+C3$d$+C4$d$+C5$d$.

Electric charges C1$c$+C2$c$+C3$c$+C4$c$+C5$c$ and C1$d$+C2$d$+C3$d$+C4$d$+C5$d$ are transferred in the reverse direction by two stages, and then, electric charges mixed in the vertical transfer stages (15D and 15G) including the independently-drivable gates V3L and V5L are extracted to the transfer gate portions W4 and W7 and retained as electric charges C1$c$+C2$c$+C3$c$+C4$c$+C5$c$+C6$c$ and C1$d$+C2$d$+C3$d$+C4$d$+C5$d$+C6$d$.

Electric charge C4$c$+C5$c$+C6$c$ is the mixture of the electric charges from 9 R-pixels in the pixel mixture unit area F3. Electric charge C1$c$+C2$c$+C3$c$+C4$c$+C5$c$+C6$c$ is the mixture of the electric charges from 18 pixels in the pixel mixture unit areas F1 and F3, which is output as electric charge CTc. Electric charge C4$d$+C5$d$+C6$d$ is the mixture of the electric charges from 9 Gr-pixels in the pixel mixture unit area F4. Electric charge C1$d$+C2$d$+C3$d$+C4$d$+C5$d$+C6$d$ is the mixture of the electric charges from 18 pixels in the pixel mixture unit areas F2 and F4, which is output as electric charge CTd.

Process in Second Line

At the first step, output electric charges CTc and CTd generated in the electric charge mixing process for the first line are transferred in the forward direction by one stage and retained in the transfer gate portions W3 and W6. Thereafter, among the mixed electric charges from the vertically-aligned three pixels in each pixel mixture unit area which are retained in the gates of the vertical-horizontal transfer linking portion 15, electric charges mixed in the vertical transfer stages (15D and 15G) that include the independently-drivable gates V3L and V5L are extracted to the transfer gate portions W4 and W7 (each gate H1) and retained as electric charges D1$c$ and D1$d$.

Thereafter, output electric charges CTc and CTd generated in the process in the first line are transferred together with electric charges which are sequentially mixed and transferred in the electric charge mixture process in the second line.

Then, electric charges D1$c$ and D1$d$ are transferred in the reverse direction by two stages and, thereafter, the electric charges mixed in the vertical transfer stages (15F and 15I) including the independently-drivable gates V3R and V5R are extracted to the transfer gate portions W6 and W9 and retained as electric charges D1$c$+D2$c$ and D1$d$+D2$d$.

Electric charges D1$c$+D2$c$ and D1$d$+D2$d$ are transferred in the forward direction by four stages, and then, electric charges mixed in the vertical transfer stages (15B and 15E) including the independently-drivable gates V3 and V5 are extracted to the transfer gate portions W2 and W5 and retained as electric charges D1$c$+D2$c$+D3$c$ and D1$d$+D2$d$+D3$d$.

Electric charge D1$c$+D2$c$+D3$c$ is the mixture of the electric charges from 9 Gb-pixels in the pixel mixture unit area F5. Electric charge D1$d$+D2$d$+D3$d$ is the mixture of the electric charges from 9 B-pixels in the pixel mixture unit area F6. Hereinafter, the subsequent steps of the mixture process on electric charges D1$c$+D2$c$+D3$c$ and D1$d$+D2$d$+D3$d$ are only described.

Electric charges D1$c$+D2$c$+D3$c$ and D1$d$+D2$d$+D3$d$ are transferred in the reverse direction by two stages, and then, electric charges mixed in the vertical transfer stages (15D and 15G) including the independently-drivable gates V3L and V5L are extracted to the transfer gate portions W4 and W7 and retained as electric charges D1$c$+D2$c$+D3$c$+D4$c$ and D1$d$+D2$d$+D3$d$+D4$d$.

Electric charges D1$c$+D2$c$+D3$c$+D4$c$ and D1$d$+D2$d$+D3$d$+D4$d$ are transferred in the reverse direction by two stages, and then, electric charges mixed in the vertical transfer stages (15F and 15I) including the independently-drivable gates V3R and V5R are extracted to the transfer gate portions W6 and W9 and retained as electric charges D1$c$+D2$c$+D3$c$+D4$c$+D5$c$ and D1$d$+D2$d$+D3$d$+D4$d$+D5$d$.

Electric charges D1$c$+D2$c$+D3$c$+D4$c$+D5$c$ and D1$d$+D2$d$+D3$d$+D4$d$+D5$d$ are transferred in the forward direction by four stages, and then, electric charges mixed in the vertical transfer stages (15B and 15E) including the independently-drivable gates V3 and V5 are extracted to the transfer gate portions W2 and W5 and retained as electric charges D1$c$+D2$c$+D3$c$+D4$c$+D5$c$+D6$c$ and D1$d$+D2$d$+D3$d$+D4$d$+D5$d$+D6$d$.

Electric charge D4$c$+D5$c$+D6$c$ is the mixture of the electric charges from 9 R-pixels in the pixel mixture unit area F7.

Electric charge D1c+D2c+D3c+D4c+D5c+D6c is the mixture of the electric charges from 18 pixels in the pixel mixture unit areas F5 and F7, which is output as electric charge DTc. Electric charge D4d+D5d+D6d is the mixture of the electric charges from 9 Gr-pixels in the pixel mixture unit area F8. Electric charge D1d+D2d+D3d+D4d+D5d+D6d is the mixture of the electric charges from 18 pixels in the pixel mixture unit areas F6 and F8, which is output as electric charge DTd.

Process in Third Line

At the first step, output electric charges CTc, CTd, DTc and DTd generated in the electric charge mixing process for the first and second lines are retained in the transfer gate portions W1, W4, W2 and W5, respectively. Thereafter, among the mixed electric charges from the vertically-aligned three pixels in each pixel mixture unit area which are retained in the gates of the vertical-horizontal transfer linking portion 15, electric charges mixed in the vertical transfer stages (15C and 15F) that include the independently-drivable gates V3L and V5L are extracted to the transfer gate portions W3 and W6 (each gate H1) and retained as electric charges E1c and E1d.

Thereafter, output electric charges CTc, CTd, DTc and DTd generated in the electric charge mixing process for the first and second lines are transferred together with electric charges which are sequentially mixed and transferred in the electric charge mixture process in the third line.

Then, electric charges E1c and E1d are transferred in the reverse direction by two stages (i.e., two stages of the transfer gate portions each consisting of the gates H1 to H4) and, thereafter, the electric charges mixed in the vertical transfer stages (15E and 15H) including the independently-drivable gates V3 and V5 are extracted to the transfer gate portions W5 and W8 and retained as electric charges E1c+E2c and E1d+E2d.

Electric charges E1c+E2c and E1d+E2d are transferred in the reverse direction by two stages, and then, electric charges mixed in the vertical transfer stages (15G and 15J) including the independently-drivable gates V3L and V5L are extracted to the transfer gate portions W7 and W10 and retained as electric charges E1c+E2c+E3c and E1d+E2d+E3d.

Electric charge E1c+E2c+E3c is the mixture of the electric charges from 9 B-pixels in the pixel mixture unit area F1. Electric charge E1d+E2d+E3d is the mixture of the electric charges from 9 Gb-pixels in the pixel mixture unit area F2. Hereinafter, the subsequent steps of the mixture process on electric charges E1c+E2c+E3c and E1d+E2d+E3d are only described.

Electric charges E1c+E2c+E3c and E1d+E2d+E3d are transferred in the forward direction by one stage, and then, electric charges mixed in the vertical transfer stages (15F and 15I) including the independently-drivable gates V3R and V5R are extracted to the transfer gate portions W6 and W9 and retained as electric charges E1c+E2c+E3c+E4c and E1d+E2d+E3d+E4d.

Electric charges E1c+E2c+E3c+E4c and E1d+E2d+E3d+E4d are transferred in the forward direction by four stages, and then, electric charges mixed in the vertical transfer stages (15B and 15E) including the independently-drivable gates V3 and V5 are extracted to the transfer gate portions W2 and W5 and retained as electric charges E1c+E2c+E3c+E4c+E5c and E1d+E2d+E3d+E4d+E5d.

Electric charges E1c+E2c+E3c+E4c+E5c and E1d+E2d+E3d+E4d+E5d are transferred in the reverse direction by two stages, and then, electric charges mixed in the vertical transfer stages (15D and 15G) including the independently-drivable gates V3L and V5L are extracted to the transfer gate portions W4 and W7 and retained as electric charges E1c+E2c+E3c+E4c+E5c+E6c and E1d+E2d+E3 d+E4d+E5 d+E6d.

Electric charge E4c+E5c+E6c is the mixture of the electric charges from 9 R-pixels in the pixel mixture unit area F3. Electric charge E1c+E2c+E3c+E4c+E5c+E6c is the mixture of the electric charges from 18 pixels in the pixel mixture unit areas F1 and F3, which is output as electric charge ETc. Electric charge E4c+E5c+E6c is the mixture of the electric charges from 9 Gr-pixels in the pixel mixture unit area F4. Electric charge E1c+E2c+E3c+E4c+E5c+E6c is the mixture of the electric charges from 18 pixels in the pixel mixture unit areas F2 and F4, which is output as electric charge ETd.

At the time when the process in the third line is completed, the electric charges are transferred in the forward direction by two stages, so that output electric charges CTc (placed in the transfer gate portion W0 but not shown in FIG. 6), DTc, ETc, CTd, DTd, ETd, CTe, DTe, ETe, CTf, DTf, ETf . . . are retained in the transfer gate portions W0 (not shown in FIG. 6: neighboring transfer gate portion of the transfer gate portion W1 at the forward direction side), W1, W2, W3, W4, W5, W6, W7, W8, W9, W10, W11, W12 . . . of the horizontal transfer stage W. These electric charges are sequentially output from the output amplifier 14 to the outside. Output electric charge CTc is converted to an electric charge of a Mg-pixel of complementary color filter arrangement display by mixture of an electric charge of a B-pixel and an electric charge of a R-pixel of primary color filter arrangement display. Output electric charge DTc is converted to an electric charge of a Ye-pixel of complementary color filter arrangement display by mixture of an electric charge of a Gb-pixel and an electric charge of a R-pixel of primary color filter arrangement display. Output electric charge ETc is converted to an electric charge of a Mg-pixel of complementary color filter arrangement display by mixture of an electric charge of a B-pixel and an electric charge of a R-pixel of primary color filter arrangement display. Output electric charge CTd is converted to an electric charge of a G-pixel of complementary color filter arrangement display by mixture of an electric charge of a Gb-pixel and an electric charge of a Gr-pixel of primary color filter arrangement display. Output electric charge DTd is converted to an electric charge of a Cy-pixel of complementary color filter arrangement display by mixture of an electric charge of a B-pixel and an electric charge of a Gr-pixel of primary color filter arrangement display. Output electric charge ETd is converted to an electric charge of a G-pixel of complementary color filter arrangement display by mixture of an electric charge of a Gb-pixel and an electric charge of a Gr-pixel of primary color filter arrangement display.

In the above process of mixing electric charges of pixels, a feature of embodiment 2 resides in that electric charges are transferred not only in the forward direction but also in the reverse direction in the horizontal transfer stage W. Thus, as will be described later in detail, in embodiment 1, gate bias wires of the gates H1 to H4 which are charge transfer devices (e.g., CCD) placed in the horizontal transfer stage are separate from each other.

[Pixel Mixture in Second Field]

Figure 8:
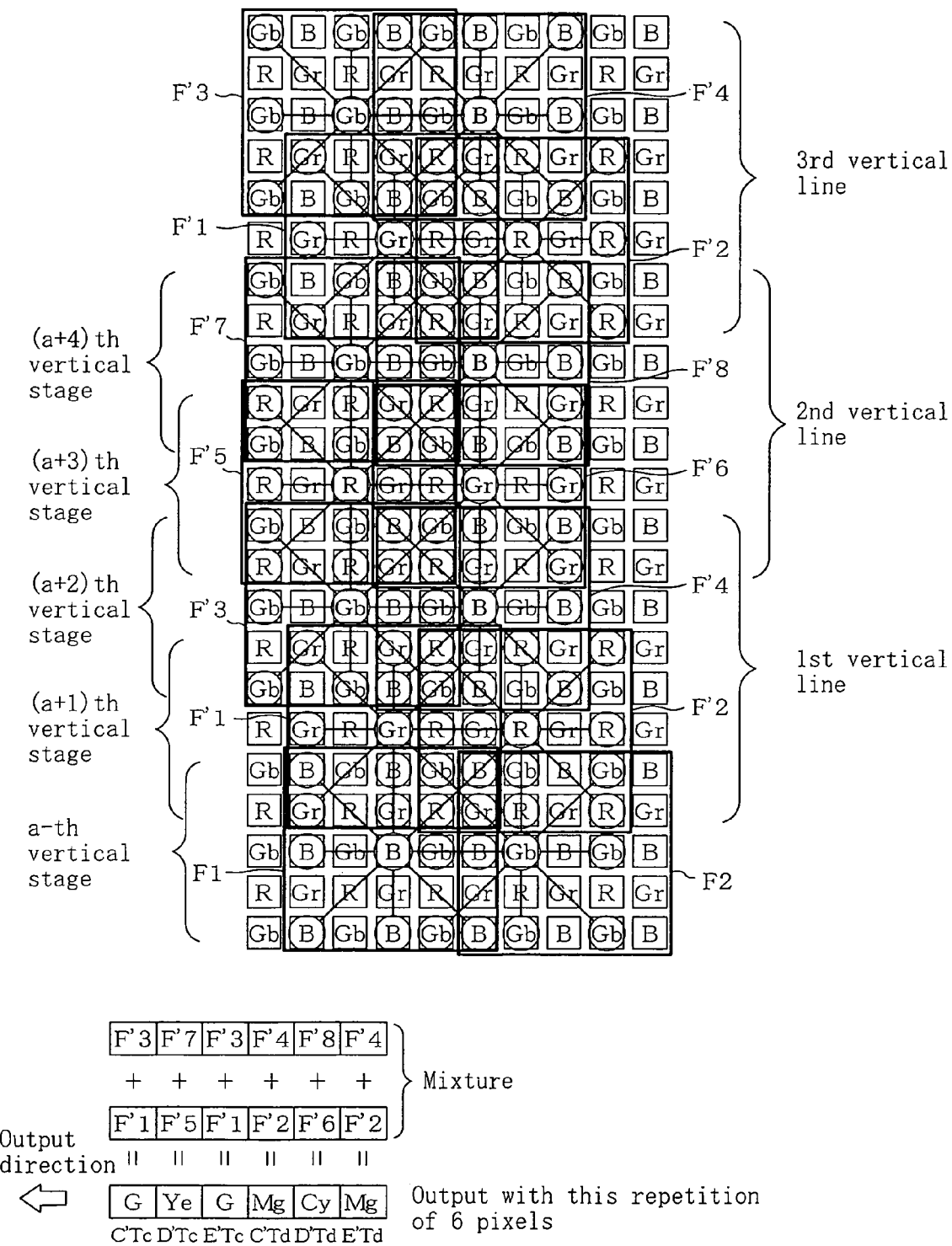
FIG. 8 generally illustrates the pixel mixture in the second field according to embodiment 2.

Next, pixel mixture for the second field is described. Herein, the drawings corresponding to FIGS. 5 and 6 are omitted. FIG. 8 illustrates a general procedure of pixel mixture in the second field. In FIG. 8, only a color filter pattern is shown while illustration of gates is omitted.

As shown in FIG. 8, pixel mixture unit areas F'1, F'2, F'3, F'4, F'5, F'6, F'7 and F'8 in the second field are placed at positions shifted upward by three pixels from pixel mixture unit areas F1, F2, F3, F4, F5, F6, F7 and F8, respectively.

The procedure of extracting electric charges of pixels from the pixel mixture unit areas F'1, F'2, F'3, F'4, F'5, F'6, F'7 and F'8 to the vertical transfer stages 12 and performing 3-pixel mixture in the gates at the lowermost part is the same as that described above as to the first field. The procedure of mixing electric charges in the horizontal transfer stage W is basically the same as that described with FIG. 6. In the last step, 6 electric charges generated by mixture in the first to third lines are output from the output amplifier.

As apparent from FIG. 8 and the descriptions provided above, in the process on the first line and third line of the second field, all of the electric charges of Gr-pixels in the pixel mixture unit area F'1 (9 Gr-pixels) and all of the electric charges of Gb-pixels in the pixel mixture unit area F'3 (9 Gb-pixels) are mixed to generate an electric charge of a G-pixel used in complementary color filter arrangement display (output electric charges C'Tc and E'Tc). Meanwhile, all of the electric charges of R-pixels in the pixel mixture unit area F'2 (9 R-pixels) and all of the electric charges of B-pixels in the pixel mixture unit area F'4 (9 B-pixels) are mixed to generate an electric charge of a Mg-pixel used in complementary color filter arrangement display (output electric charges C'Td and E'Td).

In the process on the second line of the second field, all of the electric charges of R-pixels in the pixel mixture unit area F'5 (9 R-pixels) and all of the electric charges of Gb-pixels in the pixel mixture unit area F'7 (9 Gb-pixels) are mixed to generate an electric charge of a Ye-pixel used in complementary color filter arrangement display (output electric charge D'Tc). Meanwhile, all of the electric charges of Gr-pixels in the pixel mixture unit area F'6 (9 Gr-pixels) and all of the electric charges of B-pixels in the pixel mixture unit area F'8 (9 B-pixels) are mixed to generate an electric charge of a Cy-pixel used in complementary color filter arrangement display (output electric charge D'Td).

After electric charges CTc, DTc, ETc, CTd, DTd and ETd generated in the pixel mixture process in the first field are sequentially output to the outside, output electric charge C'Tc of a G-pixel, output electric charge D'Tc of a Ye-pixel, output electric charge E'Tc of a G-pixel, output electric charge C'Td of a Mg-pixel, output electric charge D'Td of a Cy-pixel, and output electric charge E'Td of a Mg-pixel are sequentially output to the outside. That is, the electric charges of the pixels of the first field and the electric charges of the pixels of the second field are transferred from the output amplifier 14 to the outside based on an interlaced scanning format.

In the solid state imaging device of embodiment 2, the pixel use rate is 100% in both the pixel mixture process for the first field and the pixel mixture process for the second field, and therefore, a moving picture with a small frame lag can be obtained with no increase in the amount of electric charges of pixels. As a result, a moving picture suitable to various systems based on the interlaced scanning format can be output.

Embodiment 3

Figure 9:
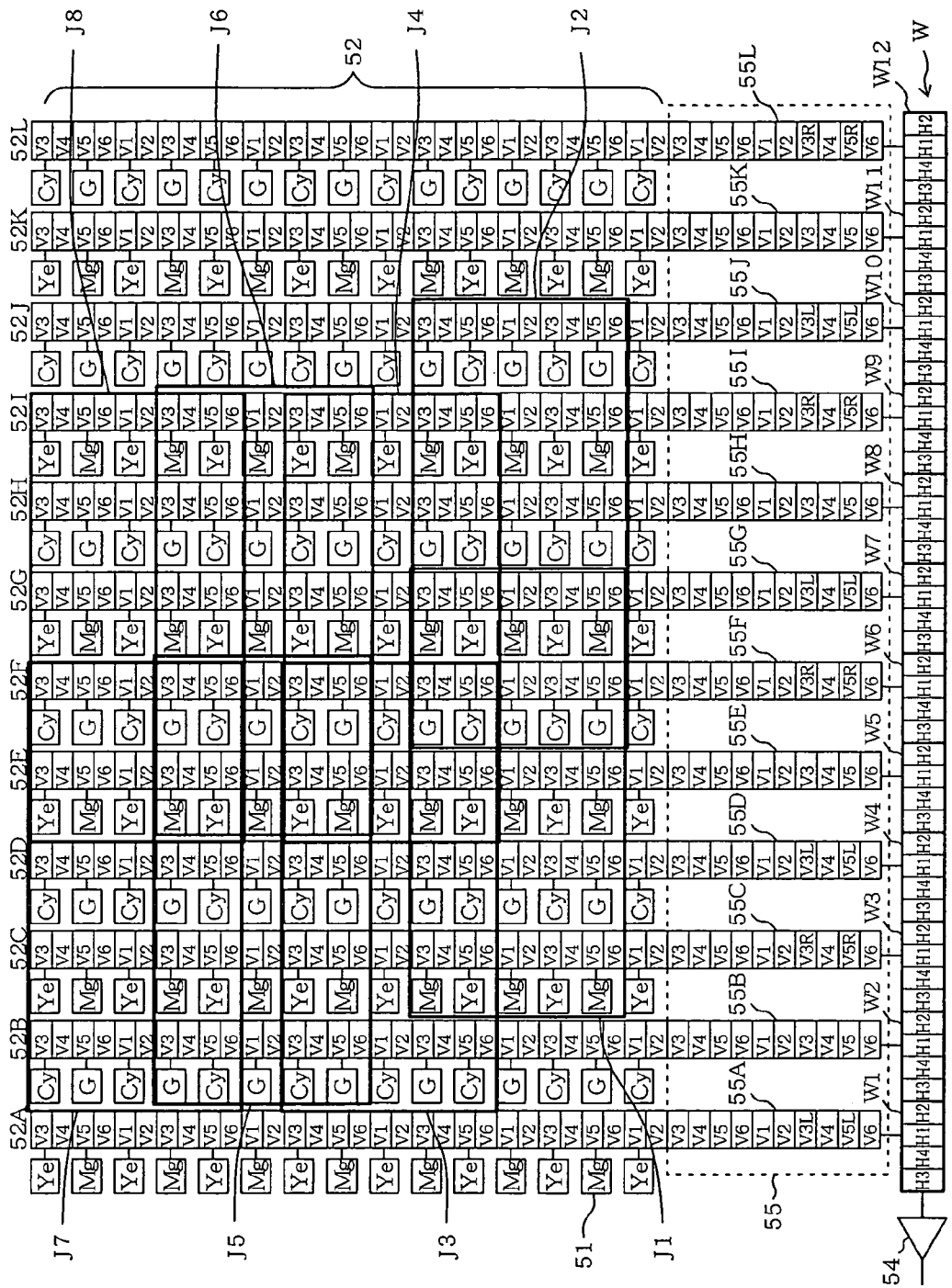
FIG. 9 is a plan view schematically showing an arrangement of components in a CCD solid state imaging element of a color solid state imaging device according to embodiment 3 of the present invention.

FIG. 9 is a plan view schematically showing an arrangement of components in a CCD solid state imaging element of a color solid state imaging device according to embodiment 3. The solid state imaging element of embodiment 3 includes a large number of pixels 51 arranged in a matrix. Each pixel 51 includes a photoelectric conversion element and a color filter attached over the front face of the photoelectric conversion element. The pixels 51 include G-pixels corresponding to green filter regions (shown by "G" in FIG. 9), Cy-pixels corresponding to cyan filter regions (shown by "Cy" in FIG. 9), Mg-pixels corresponding to magenta filter regions (shown by "Mg" in FIG. 9), and Ye-pixels corresponding to yellow filter regions (shown by "Ye" in FIG. 9). That is, the solid state imaging element of embodiment 3 has a complementary mosaic arrangement structure.

The solid state imaging device of embodiment 3 includes: a 6-phase vertical transfer stage (first-direction transfer stage) 52 (52A, 52B, . . . ) which is formed by connecting gates V1 to V6 in series; a horizontal transfer stage (second-direction transfer stage) W which is formed by connecting 4-phase transfer gate portions W1, W2, . . . , in series, each 4-phase transfer gate portion including gates H1, H2, H3 and H4; an output amplifier 54 for outputting electric charges accumulated in the horizontal transfer stage W; and a vertical-horizontal transfer linking portion 55 at the end stage of vertical transfer which has the gates capable of being independently driven (gates V3, V3R, V3L, V5, V5R, and V5L). The vertical transfer stage 52, the vertical-horizontal transfer linking portion 55, and the horizontal transfer stage W constitute means for performing a pixel mixture process for the first field and a pixel mixture process for the second field, which will be described later. Further, the output amplifier 54 functions as means for outputting a signal of a pixel which is obtained through the pixel mixture processes for the first and second fields as a signal for interlaced scanning.

Herein, the odd-numbered gates, e.g., gates V1, V3, . . . of the transfer stages 52A, 52B, . . . are each connected to a photoelectric conversion element of a corresponding pixel to read an electric charge from the pixel. The read electric charge is transferred by the gates V1 to V6.

The gates H1 and H3 of the transfer gate portions W1, W2, . . . in the horizontal transfer stage W has the function of retaining an electric charge transferred from the vertical-horizontal transfer linking portion 55. The gates H2 and H4 function as a barrier against the movement of the electric charge through the gates H1 and H3. Herein, as will be described later, the gates H1, H2, H3 and H4 of the transfer gate portions W1, W2, . . . in the horizontal transfer stage W are independently wired.

The pixels 51 arranged in a matrix are grouped into pixel mixture unit areas according to the method for processing captured-image data. In embodiment 3, the pixels 11 are grouped into basic units J of pixel mixture areas, each of which is formed by 5×5 pixels. The color of a filter portion corresponding to a pixel at the center of each pixel mixture unit area J represents the mixed color in each pixel mixture unit area. In the example of embodiment 3, each pixel mixture unit area is 5 rows×5 columns.

As shown in FIG. 9, in embodiment 3, the pixel mixture unit areas of the first field include a pixel mixture unit area J1 of Mg, a pixel mixture unit area J2 of G, a pixel mixture unit area J3 of Cy, a pixel mixture unit area J4 of Ye, a pixel mixture unit area J5 of G, a pixel mixture unit area J6 of Mg, a pixel mixture unit area J7 of Cy, and a pixel mixture unit area J8 of Ye. In the specification of the present application, the term "pixel mixture unit area" is defined so as to include an unit area in which addition of electric charges in a MOS solid state imaging element is performed.

In the example described herein, neighboring pixel mixture unit areas overlap one another by two pixels both horizontally and vertically. Although not shown in FIG. 9, the pixel mixture unit areas J1 to J8 repeatedly occur while overlapping one another both vertically and horizontally.

The transfer stages 52A, 52B, . . . perform basic transfer in 6-phase mode. It should be noted that each of the transfer stages 52A, 52B, . . . has independent wires of 12 phases for convenience of pixel mixture. In embodiment 3, the vertical transfer stages 52 and the vertical-horizontal transfer linking portions 55 are separately controlled.

[Pixel Mixture in First Field]

In embodiment 3, a method which is basically the same as that described in embodiment 1 is used to extract electric charges of the pixels of the pixel mixture unit areas J1 to J8 to the gates of the vertical transfer stages, downwardly transfer the extracted electric charges, and mix the electric charges on a three-pixel by three-pixel basis, only except that different numbers are assigned to the vertical transfer stages from which the electric charges of the pixels of the pixel mixture unit areas J1 to J8 are extracted. The procedures of the transfer and mixture are the same as those described in embodiment 1, and therefore, the descriptions thereof are herein omitted.

Figure 10:
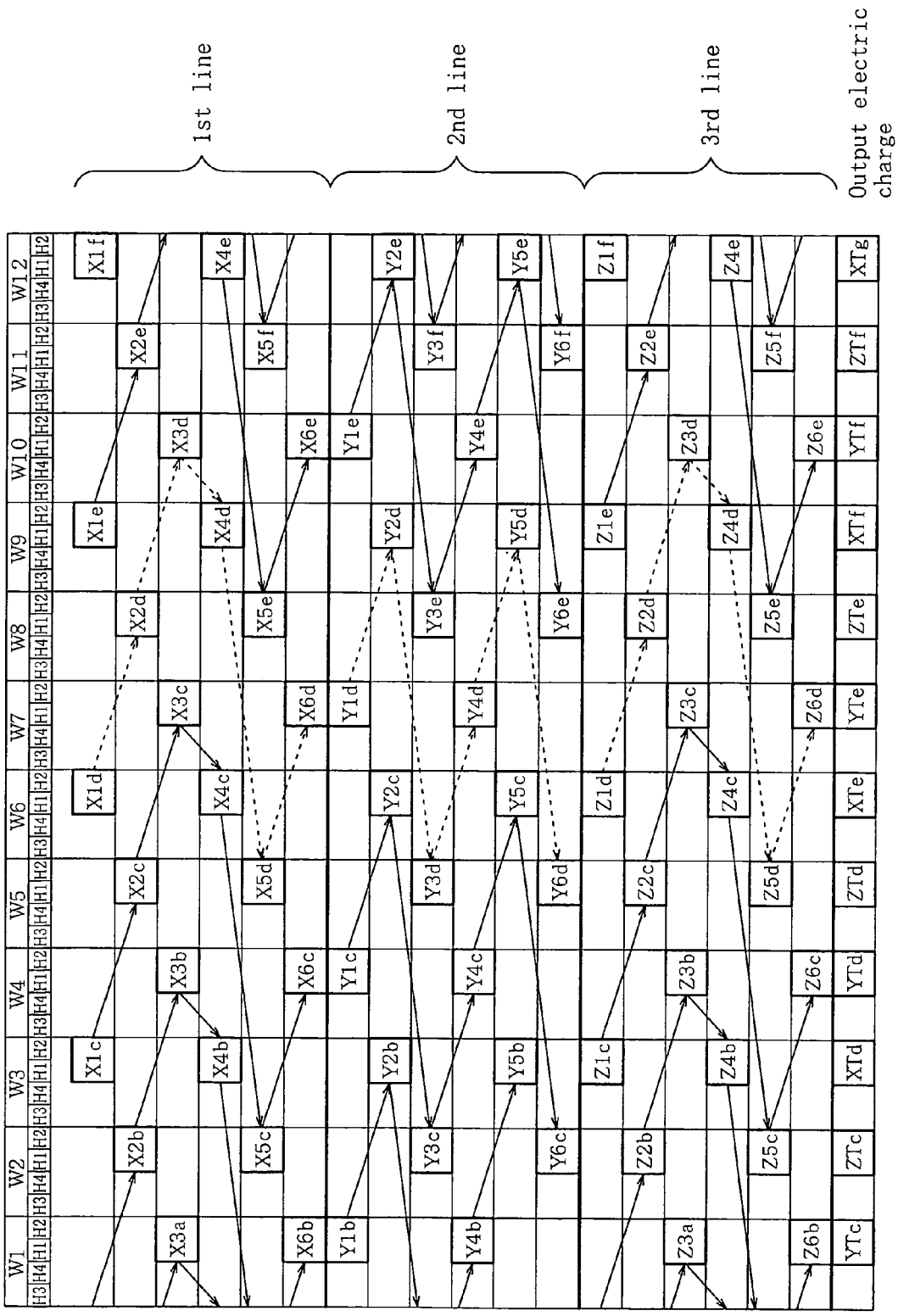
FIG. 10 illustrates the procedure of a pixel mixture process for the first field according to embodiment 3.
Figure 11:
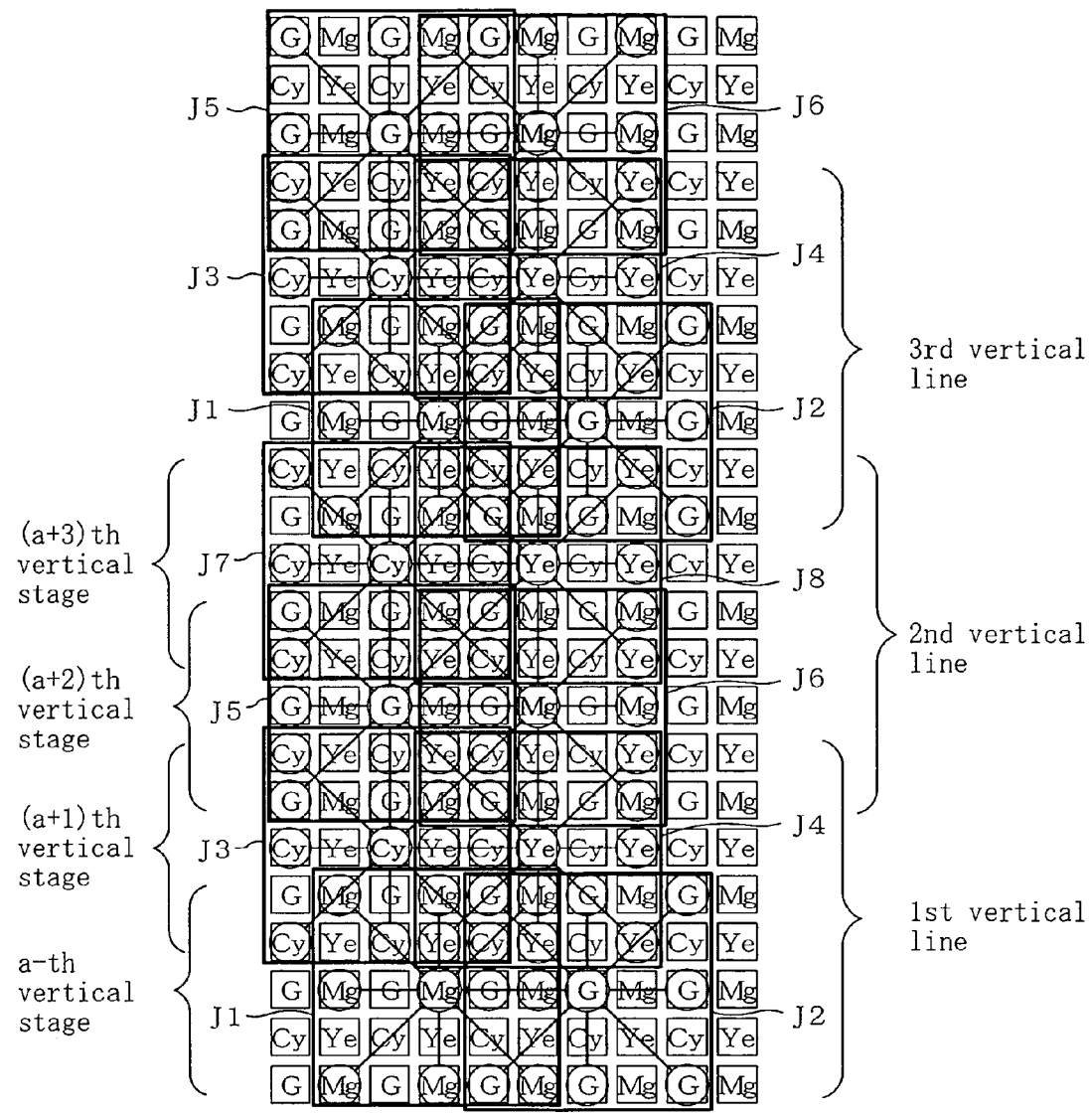
FIG. 11 generally illustrates the pixel mixture in the first field according to embodiment 3.

FIG. 10 illustrates the procedure of mixing electric charges within 8 pixel mixture unit areas in the first field. In FIG. 10, the horizontal axis represents the position of the transfer gate portions in the horizontal transfer stage W, and the vertical axis represents the time.

In embodiment 3, only the processes of mixing electric charges $X1c$ to $X6c$, $X1d$ to $X6d$, $Y1c$ to $Y6c$, $Y1d$ to $Y6d$, $Z1c$ to $Z6c$ and $Z1d$ to $Z6d$ are described. However, in actuality, the other electric charges, e.g., electric charges $X1e$ to $X6e$, $Y1e$ to $Y6e$, and $Z1e$ to $Z6e$ are also mixed through the same procedure as shown in FIG. 10.

Process in First Line

At the first step, among the mixed electric charges from the vertically-aligned three pixels in each pixel mixture unit area which are retained in the gates of the vertical-horizontal transfer linking portion 55, electric charges mixed in the vertical transfer stages (15C and 15F) that include the independently-drivable gates V3R and V5R are extracted to the transfer gate portions W3 and W6 (each gate H1) and retained as electric charges $X1c$ and $X1d$. Hereinafter, FIG. 10 only shows the electric charges extracted from the vertical transfer stages but, in actuality, the electric charges extracted from the vertical lines are sequentially mixed.

Then, electric charges $X1c$ and $X1d$ are transferred in the reverse direction by two stages (i.e., two stages of the transfer gate portions each consisting of the gates H1 to H4) and, thereafter, the electric charges mixed in the vertical transfer stages (55E and 55H) including the independently-drivable gates V3 and V5 are extracted to the transfer gate portions W5 and W8 and retained as electric charges $X1c+X2c$ and $X1d+X2d$.

Electric charges $X1c+X2c$ and $X1d+X2d$ are transferred in the reverse direction by two stages, and then, electric charges mixed in the vertical transfer stages (15G and 15J) including the independently-drivable gates V3L and V5L are extracted to the transfer gate portions W7 and W10 and retained as electric charges $X1c+X2c+X3c$ and $X1d+X2d+X3d$.

Electric charge $X1c+X2c+X3c$ is the mixture of the electric charges from 9 Mg-pixels in the pixel mixture unit area J1. Electric charge $X1d+X2d+X3d$ is the mixture of the electric charges from 9 G-pixels in the pixel mixture unit area J2. Hereinafter, the subsequent steps of the mixture process on electric charges $X1c+X2c+X3c$ and $X1d+X2d+X3d$ are only described.

Electric charges $X1c+X2c+X3c$ and $X1d+X2d+X3d$ are transferred in the forward direction by one stage, and then, electric charges mixed in the vertical transfer stages (55F and 55I) including the independently-drivable gates V3R and V5R are extracted to the transfer gate portions W6 and W9 and retained as electric charges $X1c+X2c+X3c+X4c$ and $X1d+X2d+X3d+X4d$.

Electric charges $X1c+X2c+X3c+X4c$ and $X1d+X2d+X3d+X4d$ are transferred in the forward direction by four stages, and then, electric charges mixed in the vertical transfer stages (55B and 55E) including the independently-drivable gates V3 and V5 are extracted to the transfer gate portions W2 and W5 and retained as electric charges $X1c+X2c+X3c+X4c+X5c$ and $X1d+X2d+X3d+X4d+X5d$.

Electric charges $X1c+X2c+X3c+X4c+X5c$ and $X1d+X2d+X3d+X4d+X5d$ are transferred in the reverse direction by two stages, and then, electric charges mixed in the vertical transfer stages (55D and 55G) including the independently-drivable gates V3L and V5L are extracted to the transfer gate portions W4 and W7 and retained as electric charges $X1c+X2c+X3c+X4c+X5c+X6c$ and $X1d+X2d+X3d+X4d+X5d+X6d$.

Electric charge $X4c+X5c+X6c$ is the mixture of the electric charges from 9 Cy-pixels in the pixel mixture unit area J3. Electric charge $X1c+X2c+X3c+X4c+X5c+X6c$ is the mixture of the electric charges from 18 pixels in the pixel mixture unit areas J1 and J3, which is output as electric charge XTc. Electric charge $X4d+X5d+X6d$ is the mixture of the electric charges from 9 Ye-pixels in the pixel mixture unit area J4. Electric charge $X1d+X2d+X3d+X4d+X5d+X6d$ is the mixture of the electric charges from 18 pixels in the pixel mixture unit areas J2 and J4, which is output as electric charge XTd.

Process in Second Line

At the first step, output electric charges XTc and XTd generated in the electric charge mixing process for the first line are transferred in the forward direction by one stage and retained in the transfer gate portions W3 and W6. Thereafter, among the mixed electric charges from the vertically-aligned three pixels in each pixel mixture unit area which are retained in the gates of the vertical-horizontal transfer linking portion 55, electric charges mixed in the vertical transfer stages (55D and 55G) that include the independently-drivable gates V3L and V5L are extracted to the transfer gate portions W4 and W7 (each gate H1) and retained as electric charges $V1c$ and $V1d$.

Thereafter, output electric charges XTc and XTd generated in the process in the first line are transferred together with electric charges which are sequentially mixed and transferred in the electric charge mixture process in the second line.

Then, electric charges $D1c$ and $D1d$ are transferred in the reverse direction by two stages and, thereafter, the electric charges mixed in the vertical transfer stages (55F and 55I) including the independently-drivable gates V3R and V5R are extracted to the transfer gate portions W6 and W9 and retained as electric charges $Y1c+Y2c$ and $Y1d+Y2d$.

Electric charges $Y1c+Y2c$ and $Y1d+Y2d$ are transferred in the forward direction by four stages, and then, electric charges mixed in the vertical transfer stages (55B and 55E) including the independently-drivable gates V3 and V5 are extracted to the transfer gate portions W2 and W5 and retained as electric charges $Y1c+Y2c+Y3c$ and $Y1d+Y2d+Y3d$.

Electric charge $Y1c+Y2c+Y3c$ is the mixture of the electric charges from 9 G-pixels in the pixel mixture unit area J5. Electric charge $Y1d+Y2d+Y3d$ is the mixture of the electric charges from 9 Mg-pixels in the pixel mixture unit area J6. Hereinafter, the subsequent steps of the mixture process on electric charges $Y1c+Y2c+Y3c$ and $Y1d+Y2d+Y3d$ are only described.

Electric charges $Y1c+Y2c+Y3c$ and $Y1d+Y2d+Y3d$ are transferred in the reverse direction by two stages, and then, electric charges mixed in the vertical transfer stages (55D and 55G) including the independently-drivable gates V3L and V5L are extracted to the transfer gate portions W4 and W7 and retained as electric charges $Y1c+Y2c+Y3c+Y4c$ and $Y1d+Y2d+Y3d+Y4d$.

Electric charges $Y1c+Y2c+Y3c+Y4c$ and $Y1d+Y2d+Y3d+Y4d$ are transferred in the reverse direction by two stages, and then, electric charges mixed in the vertical transfer stages (55F and 55I) including the independently-drivable gates V3R and V5R are extracted to the transfer gate portions W6 and W9 and retained as electric charges Y1c+Y2c+Y3c+Y4c+Y5c and Y1d+Y2d+Y3d+Y4d+Y5d.

Electric charges Y1c+Y2c+Y3c+Y4c+Y5c and Y1d+Y2d+Y3d+Y4d+Y5d are transferred in the forward direction by four stages, and then, electric charges mixed in the vertical transfer stages (55B and 55E) including the independently-drivable gates V3 and V5 are extracted to the transfer gate portions W2 and W5 and retained as electric charges Y1c+Y2c+Y3c+Y4c+Y5c+Y6c and Y1d+Y2d+Y3d+Y4d+Y5d+Y6d.

Electric charge Y4c+Y5c+Y6c is the mixture of the electric charges from 9 Cy-pixels in the pixel mixture unit area J7. Electric charge Y1c+Y2c+Y3c+Y4c+Y5c+Y6c is the mixture of the electric charges from 18 pixels in the pixel mixture unit areas J5 and J7, which is output as electric charge YTc. Electric charge Y4d+Y5d+Y6d is the mixture of the electric charges from 9 Ye-pixels in the pixel mixture unit area J8. Electric charge Y1d+Y2d+Y3d+Y4d+Y5d+Y6d is the mixture of the electric charges from 18 pixels in the pixel mixture unit areas J6 and J8, which is output as electric charge YTd.

Process in Third Line

At the first step, output electric charges XTc, XTd, YTc and YTd generated in the electric charge mixing process for the first and second lines are transferred in the forward direction by two stages and retained in the transfer gate portions W1, W4, W2 and W5. Thereafter, among the mixed electric charges from the vertically-aligned three pixels in each pixel mixture unit area which are retained in the gates of the vertical-horizontal transfer linking portion 55, electric charges mixed in the vertical transfer stages (55C and 55F) that include the independently-drivable gates V3R and V5R are extracted to the transfer gate portions W3 and W6 (each gate H1) and retained as electric charges Z1c and Z1d.

Thereafter, output electric charges XTc, XTd, YTc and YTd generated in the electric charge mixing process for the first and second lines are transferred together with electric charges which are sequentially mixed and transferred in the electric charge mixture process in the third line.

Then, the electric charges Z1c and Z1d are transferred in the reverse direction by two stages (i.e., two stages of the transfer gate portions each consisting of the gates H1 to H4) and, thereafter, the electric charges mixed in the vertical transfer stages (55E and 55H) including the independently-drivable gates V3 and V5 are extracted to the transfer gate portions W5 and W8 and retained as electric charges Z1c+Z2c and Z1d+Z2d.

Electric charges Z1c+Z2c and Z1d+Z2d are transferred in the reverse direction by two stages, and then, electric charges mixed in the vertical transfer stages (55G and 55J) including the independently-drivable gates V3L and V5L are extracted to the transfer gate portions W7 and W10 and retained as electric charges Z1c+Z2c+Z3c and Z1d+Z2d+Z3d.

Electric charge Z1c+Z2c+Z3c is the mixture of the electric charges from 9 Mg-pixels in the pixel mixture unit area J1. Electric charge Z1d+Z2d+Z3d is the mixture of the electric charges from 9 G-pixels in the pixel mixture unit area J2. Hereinafter, the subsequent steps of the mixture process on electric charges Z1c+Z2c+Z3c and Z1d+Z2d+Z3d are only described.

Electric charges Z1c+Z2c+Z3c and Z1d+Z2d+Z3d are transferred in the forward direction by one stage, and then, electric charges mixed in the vertical transfer stages (15F and 15I) including the independently-drivable gates V3R and V5R are extracted to the transfer gate portions W6 and W9 and retained as electric charges Z1c+Z2c+Z3c+Z4c and Z1d+Z2d+Z3d+Z4d.

Electric charges Z1c+Z2c+Z3c+Z4c and Z1d+Z2d+Z3d+Z4d are transferred in the forward direction by four stages, and then, electric charges mixed in the vertical transfer stages (55B and 55E) including the independently-drivable gates V3 and V5 are extracted to the transfer gate portions W2 and W5 and retained as electric charges Z1c+Z2c+Z3c+Z4c+Z5c and Z1d+Z2d+Z3d+Z4d+Z5d.

Electric charges Z1c+Z2c+Z3c+Z4c+Z5c and Z1d+Z2d+Z3d+Z4d+Z5d are transferred in the reverse direction by two stages, and then, electric charges mixed in the vertical transfer stages (55D and 55G) including the independently-drivable gates V3L and V5L are extracted to the transfer gate portions W4 and W7 and retained as electric charges Z1c+Z2c+Z3c+Z4c+Z5c+Z6c and Z1d+Z2d+Z3d+Z4d+Z5d+Z6d.

Electric charge Z4c+Z5c+Z6c is the mixture of the electric charges from 9 Cy-pixels in the pixel mixture unit area J3. Electric charge Z1c+Z2c+Z3c+Z4c+Z5c+Z6c is the mixture of the electric charges from 18 pixels in the pixel mixture unit areas J1 and J3, which is output as electric charge ZTc. Electric charge Z4d+Z5d+Z6d is the mixture of the electric charges from 9 Ye-pixels in the pixel mixture unit area J4. Electric charge Z1d+Z2d+Z3d+Z4d+Z5d+Z6d is the mixture of the electric charges from 18 pixels in the pixel mixture unit areas J2 and J4, which is output as electric charge ZTd.

At the time when the process in the third line is completed, the electric charges are transferred in the forward direction by two stages, so that output electric charges XTc (placed in the transfer gate portion W0 but not shown in FIG. 10), YTc, ZTc, XTd, YTd, ZTd, XTd, YTd, ZTd, XTe, YTe, ZTe, XTf, YTf, ZTf . . . are retained in the transfer gate portions W0 (not shown in FIG. 10: neighboring transfer gate portion of the transfer gate portion W1 at the forward direction side), W1, W2, W3, W4, W5, W6, W7, W8, W9, W10, W11, W12 . . . of the horizontal transfer stage W.

These electric charges are sequentially output from the output amplifier 14 to the outside. Output electric charge XTc is the mixture of electric charges of a Mg-pixel and a Cy-pixel of complementary color filter arrangement display. Output electric charge YTc is the mixture of electric charges of a G-pixel and a Cy-pixel of complementary color filter arrangement display. Output electric charge ZTc is the mixture of electric charges of a Mg-pixel and a Cy-pixel of complementary color filter arrangement display. Output electric charge XTd is the mixture of electric charges of a G-pixel and a Ye-pixel of complementary color filter arrangement display. Output electric charge YTd is the mixture of electric charges of a Mg-pixel and a Ye-pixel of complementary color filter arrangement display. Output electric charge ZTd is the mixture of electric charges of a G-pixel and a Ye-pixel of complementary color filter arrangement display.

In the above process of mixing electric charges of pixels, a feature of embodiment 3 resides in that electric charges are transferred not only in the forward direction but also in the reverse direction in the horizontal transfer stage W. Thus, as will be described later in detail, in embodiment 3, gate bias wires of the gates H1 to H14 which are charge transfer devices (e.g., CCD) placed in the horizontal transfer stage are separate from each other.

[Pixel Mixture in Second Field]

Figure 12:
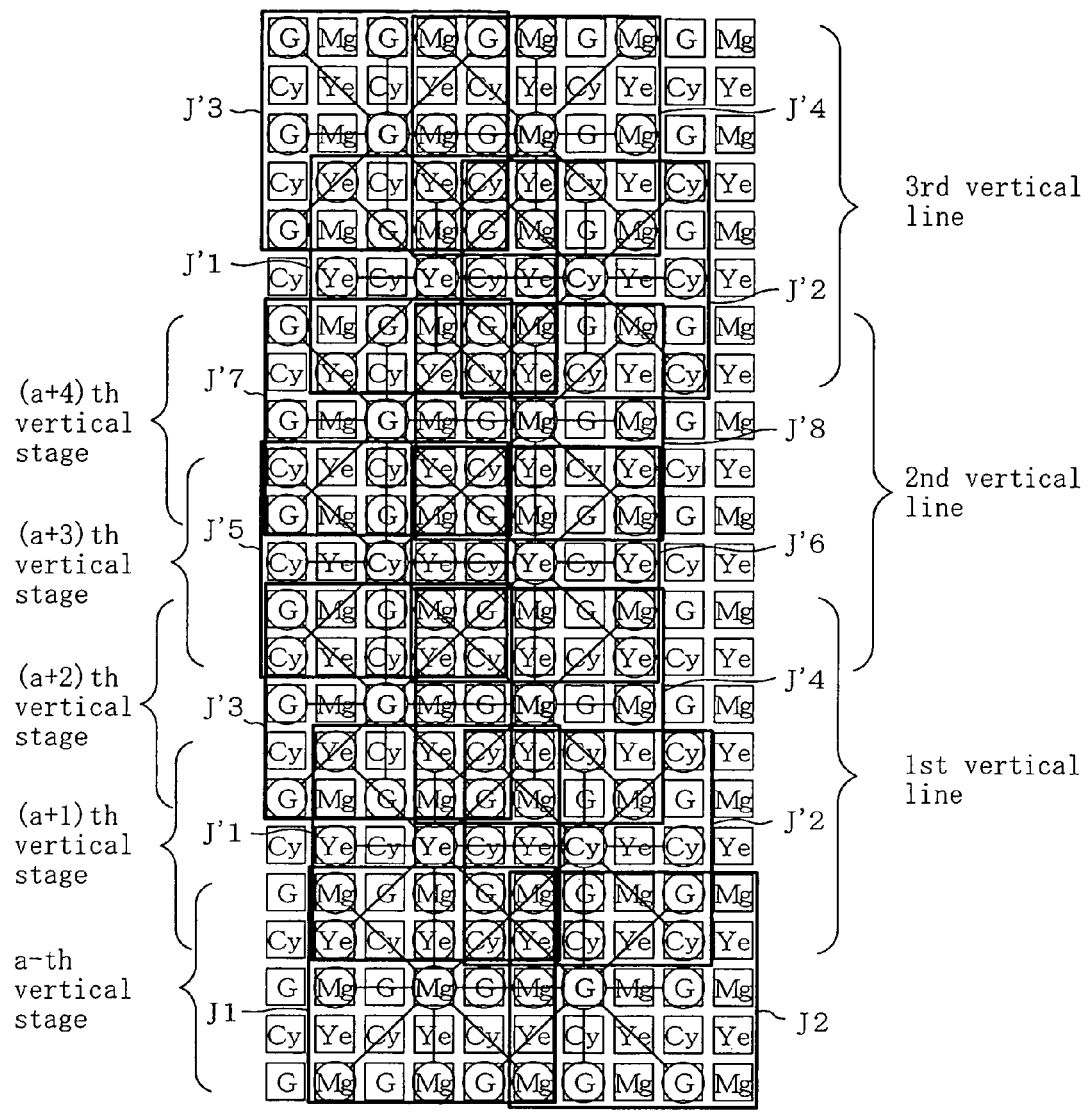
FIG. 12 generally illustrates the pixel mixture in the second field according to embodiment 3.

Next, pixel mixture for the second field is described. Herein, the drawings corresponding to FIGS. 9 and 10 are omitted. FIG. 12 illustrates a general procedure of pixel mixture in the second field. In FIG. 12, only a color filter pattern is shown while illustration of gates is omitted.

As shown in FIG. 12, pixel mixture unit areas J'1, J'2, J'3, J'4, J'5, J'6, J'7 and J'8 in the second field are placed at positions shifted upward by three pixels from pixel mixture unit areas J1, J2, J3, J4, J5, J6, J7 and J8, respectively.

The procedure of extracting electric charges of pixels from the pixel mixture unit areas J'1, J'2, J'3, J'4, J'5, J'6, J'7 and J'8 to the vertical transfer stages 12 and performing 3-pixel mixture in the gates at the lowermost part is the same as that described above as to the first field. The procedure of mixing electric charges in the horizontal transfer stage W is basically the same as that described with FIG. 10. In the last step, 6 electric charges generated by mixture in the first to third lines are output from the output amplifier.

As apparent from FIG. 12 and the descriptions provided above, in the process on the first line and third line of the second field, all of the electric charges of Ye-pixels in the pixel mixture unit area J'1 (9 Ye-pixels) and all of the electric charges of G-pixels in the pixel mixture unit area J'3 (9 G-pixels) are mixed (output electric charge Ye+G). Meanwhile, all of the electric charges of Cy-pixels in the pixel mixture unit area J'2 (9 Cy-pixels) and all of the electric charges of Mg-pixels in the pixel mixture unit area J'4 (9 Mg-pixels) are mixed (output electric charge Cy+Mg).

In the process on the second line of the second field, all of the electric charges of Cy-pixels in the pixel mixture unit area J'5 (9 Cy-pixels) and all of the electric charges of G-pixels in the pixel mixture unit area J'7 (9 G-pixels) are mixed (output electric charge Cy+G). Meanwhile, all of the electric charges of Ye-pixels in the pixel mixture unit area J'6 (9 Ye-pixels) and all of the electric charges of Mg-pixels in the pixel mixture unit area J'8 (9 Mg-pixels) are mixed (output electric charge Ye+Mg).

After electric charges XTc, YTc, ZTc, XTd, YTd and ZTd generated in the pixel mixture process in the first field are sequentially output to the outside, output electric charge X'Tc from Ye and G pixels, output electric charge Y'Tc from Cy and G pixels, output electric charge Z'Tc from Ye and G pixels, output electric charge X'Td from Cy and Mg pixels, output electric charge Y'Td from Mg and Ye pixels, and output electric charge Z'Td from Mg and Cy pixels are sequentially output to the outside. That is, the electric charges of the pixels of the first field and the electric charges of the pixels of the second field are transferred from the output amplifier 14 to the outside based on an interlaced scanning format.

In the solid state imaging device of embodiment 3, the pixel use rate is 100% in both the pixel mixture process for the first field and the pixel mixture process for the second field, and therefore, a moving picture with a small frame lag can be obtained with no increase in the amount of electric charges of pixels. As a result, a moving picture suitable to various systems based on the interlaced scanning format can be output.

In embodiment 3, a signal obtained after the pixel mixture process is an electric charge signal for a complementary color filter but may be an electric charge signal for a primary color filter.

[System of Solid State Imaging Device]

Figure 13:
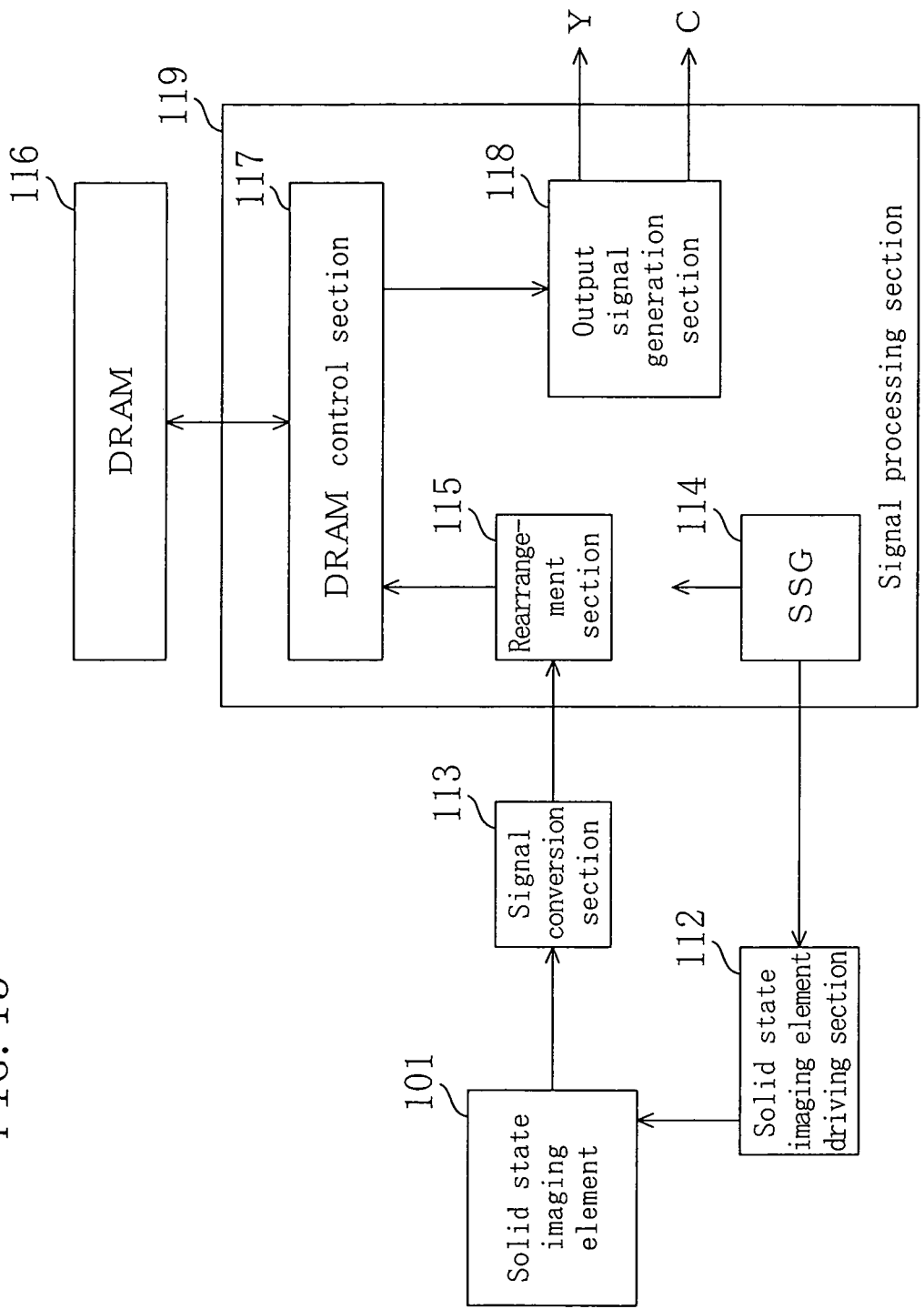
FIG. 13 is a block diagram showing a structure of a solid state imaging device which is common to embodiments 1 to 3.

FIG. 13 is a block diagram showing a structure of a solid state imaging device which is common to embodiments 1-3.

A solid state imaging element 101 is the solid state imaging element described in each embodiment. The solid state imaging element 101 converts received light to an electric signal and outputs the electric signal to a signal conversion section 113. A solid state imaging element driving section 112 outputs a control signal to control the solid state imaging element 101.

The signal conversion section 113 receives an electric signal which is an electric charge of each pixel from an output amplifier connected to the horizontal transfer stage of the solid state imaging element 101 and performs correlated double sampling (CDS), auto gain control (AGC) and analog/digital (A/D) conversion on the received electric signal. In the CDS, noise is removed from the electric signal output from the solid state imaging element 101. In the AGC, the output level of the noise-removed signal is adjusted. In the A/D conversion, the level-adjusted solid state image data is converted to a digital signal.

The signal conversion section 113 outputs the converted signals for 3 lines at one time to a rearrangement section 115.

A sync signal generator (SSG) 114 generates a reference signal which is used for determining drive timings of the solid state imaging element 101 and a signal processing section 119. That is, the SSG 114 determines the timing of a signal which is to be applied to each gate of the vertical transfer stages, the vertical-horizontal transfer linking portions, and the horizontal transfer stages shown in FIG. 1, for example. The SSG 114 outputs to the rearrangement section 115 a reference signal which is used for determining the timing of starting a field (screen) and a timing of starting a horizontal line.

A dynamic random access memory (DRAM) 116 stores digital data rearranged by the rearrangement section 115.

A DRAM control section 117 reads rearranged data which relates to electric charges of pixels and outputs the read data to an output signal generation section 118.

The output signal generation section 118 receives data relating to the electric charge which has passed through the rearrangement block and performs the Y signal process of generating/outputting a brightness signal and the C signal process of generating/outputting a color difference signal. The output signal generation section 118 performs the Y signal process to generate/output a brightness signal, but there is a possibility that an image converted from the data relating to the electric charge of a pixel to a Y signal has deteriorated sharpness. In such a case, the output signal generation section 118 further performs contour correction to emphasize the contour.

The rearrangement section 115 performs a rearrangement process on a digital signal output from the signal conversion section 113 according to the reference signal output from the SSG 114. For example, as shown in FIG. 2, the digital signal output from the horizontal transfer section of the solid state imaging element 101 and processed by the signal conversion section 113 corresponds to an one-dimensional arrangement of the signal which relates to the electric charge of a pixel (in FIG. 2, electric charges E6a, C6a, D6a, E6b, C6b and D6b are output in series). The rearrangement process restores the one-dimensional signal into the original two-dimensional arrangement.

In the above-described embodiments, a so-called zigzag mixing process is performed, i.e., the pixels of a plurality of pixel mixture unit areas (pixel mixture unit areas A1 to A8), the vertical transfer stages of the central pixels of which are shifted from one another, are mixed. Therefore, in the rearrangement section 115, the centroid is corrected while an image signal is reproduced as will be described later.

Figure 14A:
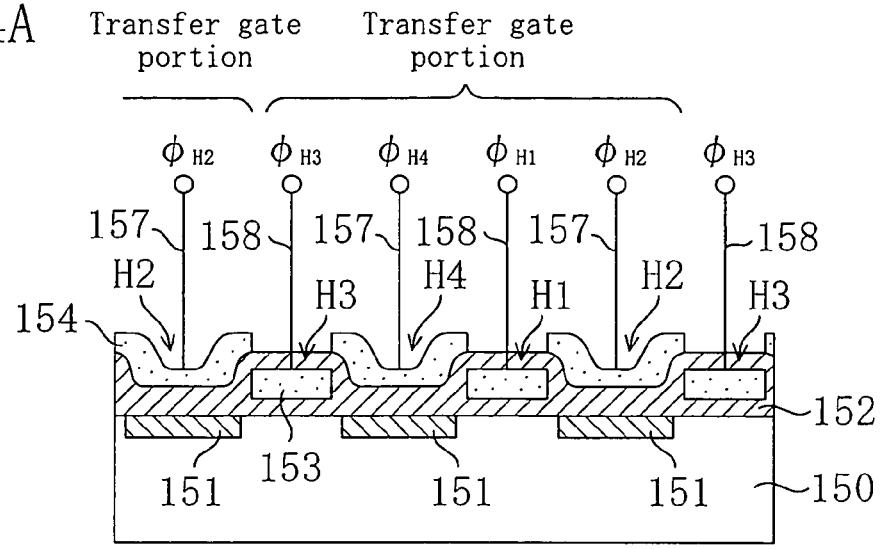
FIG. 14A is a cross-sectional view of a transfer gate portion in a horizontal transfer stage which is common to the embodiments of the present invention.
Figure 14B:
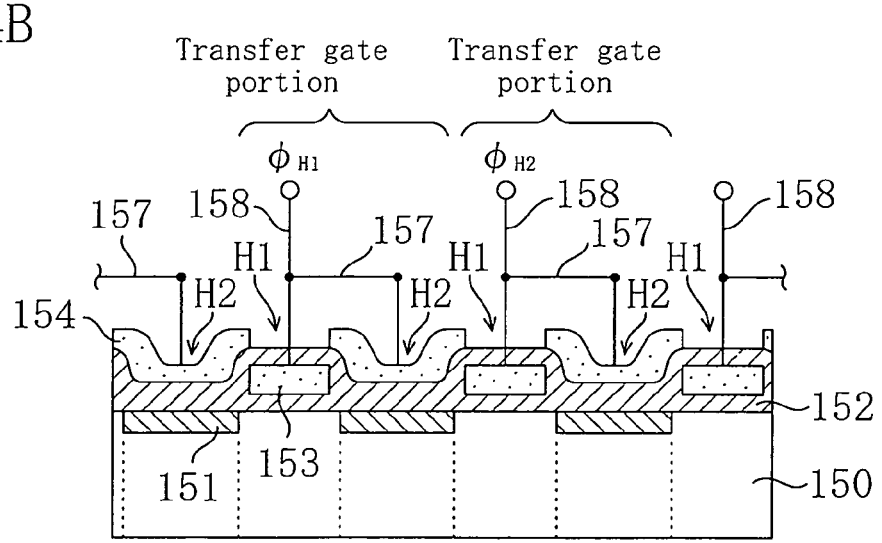
FIG. 14B is a cross-sectional view of a conventional transfer gate portion.
Figure 14C:
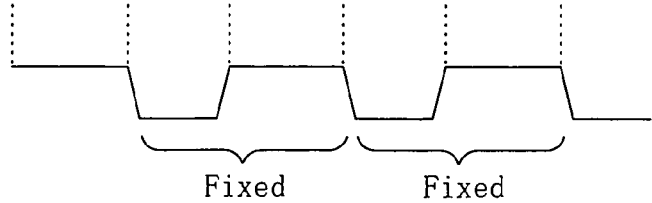
FIG. 14C shows the potential state in a cross section that traverses a p$^+$ layer and a p-type semiconductor layer of the conventional transfer gate portion.

FIG. 14A shows the potential state in a cross section of a transfer gate portion in the horizontal transfer stage which is a common structure among the embodiments of the present invention. FIG. 14B shows the potential state in a cross section of a conventional transfer gate portion. FIG. 14C shows the potential state in a cross section that traverses a $p^+$ layer 15I and a n-type semiconductor layer 150 of the conventional transfer gate portion.

As shown in FIG. 14A, each of the transfer gate portions of the solid state imaging element alternately includes the gates H1 and H3 for retaining electric charges and the gates H2 and H4 for barriers in a series arrangement. Each of the gates Hi and H3 has a polysilicon electrode 153 buried in a dielectric film 152 on a semiconductor substrate. Each of the gates H2 and H4 has an Al electrode 154 which is provided on the dielectric film 152 over the semiconductor substrate. The n-type semiconductor layer 150, which contains n-type impurities of relatively low concentration, exists under the gates H1 and H3 that retain electric charges. The p$^+$layer 151, which contains p-type impurities of high concentration, exists under the barrier gates H2 and H4. A line 157 connected to the Al electrode 154 and a line 158 connected to the polysilicon electrode 153 are separate from each other.

In a transfer gate portion of a conventional solid state imaging element, the structures of the gates H1 and H2 and the semiconductor substrates are the same as those shown in FIG. 14A except that the line 157 and the line 158, which receive biases $\phi_{H1}$ and $\phi_{H2}$ of opposite phases, are connected to each other. As shown in FIG. 14C, in one transfer gate portion, a common bias ($\phi_{H1}$ or $\phi_{H2}$) is applied to the Al electrode 154 and the polysilicon electrode 153, and therefore, the potential difference between the n-type semiconductor region 150 under the gate H1 and the p$^+$layer 15I under the gate H2 is substantially constant. Thus, in the case of the potential relationship shown in FIG. 14C, an electric charge is transferred leftward, whereas no electric charge is transferred rightward.

In the structure of a CCD according to embodiment 3 of the present invention shown in FIG. 14A, the line 157 connected to the Al electrode 154 and the line 158 connected to the polysilicon electrode 153 are separate from each other, and therefore, the relationship as to the potential levels (high/low) between the n-type semiconductor region 150 under the gate H1 and the p$^+$layer 151 under the gate H2 is inverted from that obtained when a common bias is applied. Thus, it is possible to transfer an electric charge in the reverse direction (rightward in FIG. 14C). Thus, according to embodiment 3, an electric charge can be transferred in the horizontal transfer stage W not only in the forward direction, i.e., the direction toward the output amplifier 14 (or 54), but also in the reverse direction, i.e., the direction away from the output amplifier 14 (or 54). As a result, the control described below is enabled.

Figure 20A:
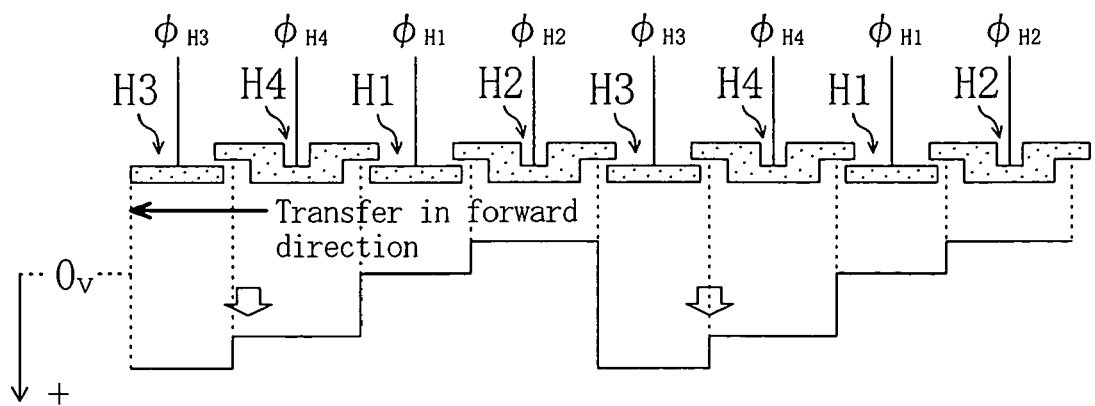
FIG. 20A illustrates biases and channel potentials in a forward transfer of electric charges at the transfer gate section of horizontal transfer.
Figure 20B:
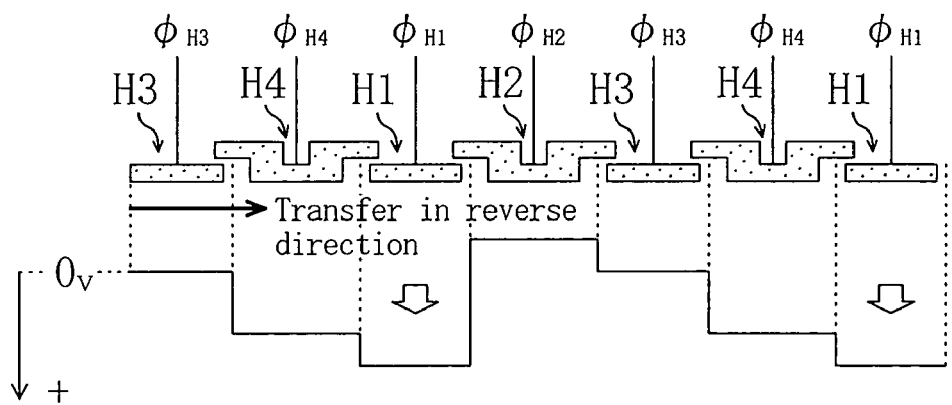
FIG. 20B illustrates biases and channel potentials in a reverse transfer of electric charges at the transfer gate section of horizontal transfer.

FIGS. 20A and 20B illustrate biases $\phi_{H1}$ to $\phi_{H4}$ and the channel potentials obtained when an electric charge is transferred in the forward direction and the reverse direction in transfer gate portions of the horizontal transfer stage.

As shown in FIG. 20A, by applying biases such that $\phi_{H1}=\phi_{H2}$, $\phi_{H3}=\phi_{H4}$, and $\phi_{H1}<\phi_{H4}$, the potential of the channel decreases in the order of gate H3, gate H4, gate H1 and gate H2. Therefore, the electric charge is transferred in the forward direction.

As shown in FIG. 20B, by applying biases such that $\phi_{H1}=\phi_{H4}$, $\phi_{H2}=\phi_{H3}$, and $\phi_{H1}<\phi_{H2}$, the potential of the channel increases in the order of gate H3, gate H4, gate H1 and gate H2. Therefore, the electric charge is transferred in the reverse direction.

Figure 21:
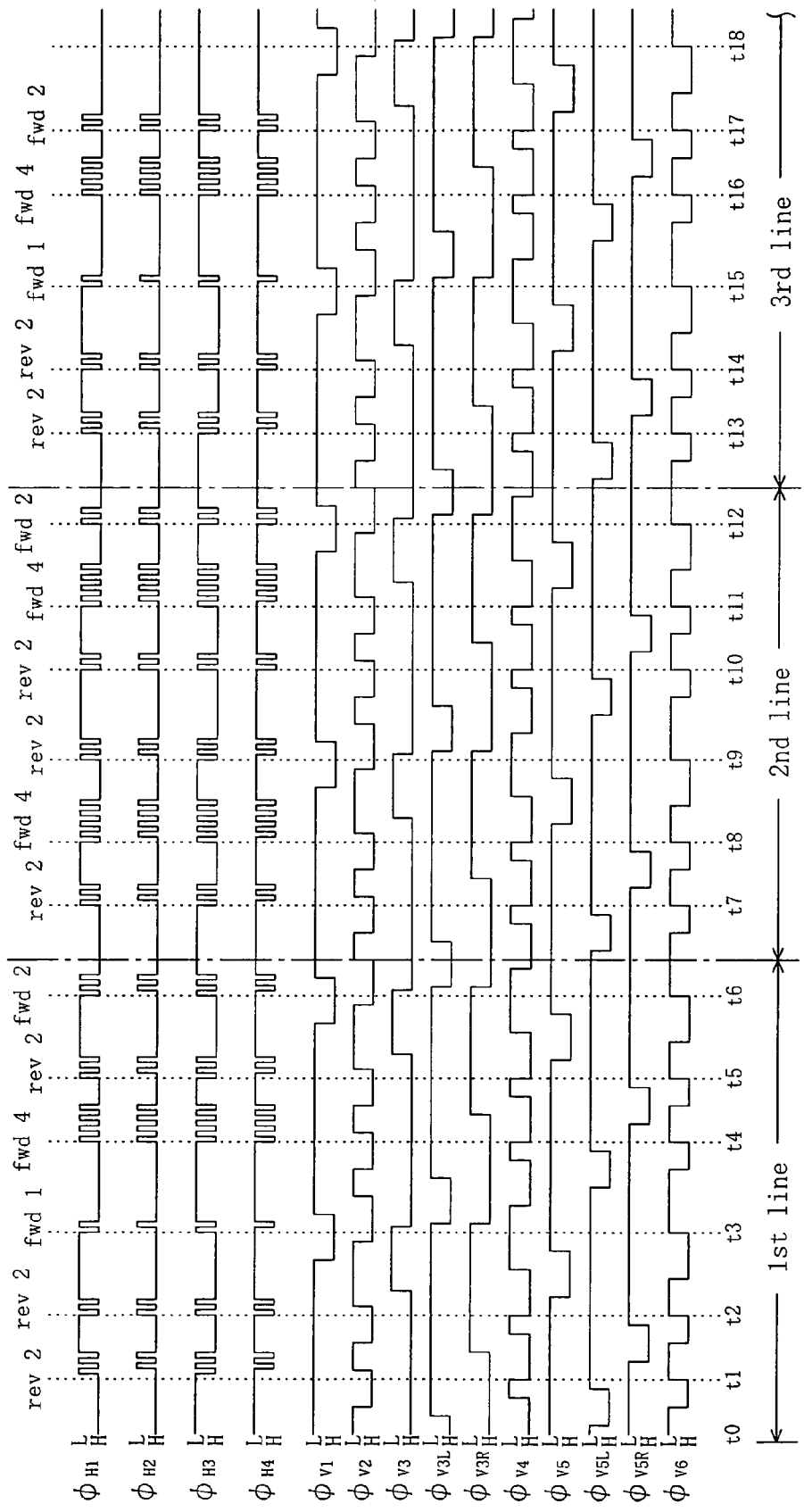
FIG. 21 is a timing chart illustrating variations over time in the biases applied to respective gates for the purpose of achieving the electric charge mixture process shown in FIG. 2 of embodiment 1.

FIG. 21 is a timing chart illustrating the variations of biases applied to the gates of the horizontal transfer stage W and the vertical-horizontal transfer linking portion 15 over time. In FIG. 21, in each pulse of the horizontal transfer stage W, the higher end is the L level (0 V) and the lower end is the H level (3.3 V). In each pulse of the vertical-horizontal transfer linking portion 15, the higher end is the L level (−8 V) and the lower end is the H level (0 V). It should be noted that FIG. 21 only shows the pulse shapes of the forward direction transfer for the purpose of clearly illustrating the number of pulses and the number of transfer stages, and the biases are always such that $\phi_{H1}=\phi_{H2}$ and $\phi_{H3}=\phi_{H4}$. In the case of the reverse direction transfer, however, the biases are always such that $\phi_{H1}=\phi_{H4}$ and $\phi_{H2}=\phi_{H3}$, and therefore, the actual pulse shapes are different from those shown in FIG. 21. Although FIG. 21 illustrates an example of a charge mixture process on the first to third lines of the first field in embodiment 1 shown in FIG. 2, the mixture process can be readily achieved even in the mixture processes of the other embodiments by appropriately modifying the biases of the horizontal transfer stage and the vertical-horizontal transfer linking portion. Hereinafter, the relationship between the biases applied in the charge mixture process of FIG. 2 and the charge mixture operation is described with reference to FIG. 21.

In the first place, in a period between time t0 and time t1, electric charges retained in the gates V3L and V4 are extracted to the horizontal transfer stage W (electric charges C1b, C1c, C1d and C1e in FIG. 2).

After time t1, the pulses of biases $\phi_{H1}$ to $\phi_{H4}$ which have the level relationship shown in FIG. 20B are supplied twice, whereby the electric charges of the horizontal transfer stage is transferred in the reverse direction by two stages (electric charges C1b, C1c, C1d and C1e in FIG. 2). Thereafter, while biases $\phi_{H1}$ to $\phi_{H4}$ of the horizontal transfer stage are fixed (i.e., while the electric charges are fixed), the electric charges retained in the gates V3R and V4 are extracted to the horizontal transfer stage W (electric charges C2b, C2c, C2d and C2e in FIG. 2) and mixed with the electric charges transferred in the horizontal transfer stage.

Thereafter, during a period from time t2 to time t6, a transfer of electric charges in the reverse direction by two stages, a transfer of electric charges in the forward direction by one stage, a transfer of electric charges in the forward direction by four stages, a transfer of electric charges in the reverse direction by two stage, and the mixture process of the transferred electric charges and electric charges extracted from the vertical-horizontal transfer linking portion are performed through the same operations in the horizontal transfer stage. This process is the electric charge mixture process in the first line shown in FIG. 2.

After time t6, the electric charges mixed in the first line (e.g., output electric charges CTc and CTd in embodiment 1) are transferred in the forward direction by two stages to be placed at positions shifted in the forward direction by one stage with respect to the electric charges which are extracted from the vertical-horizontal transfer linking portion at the start of the second line shown in FIG. 2.

Then, during a period from time t6 to time t12, a transfer of electric charges in the reverse direction by two stages, a transfer of electric charges in the forward direction by four stages, a transfer of electric charges in the reverse direction by two stage, a transfer of electric charges in the reverse direction by two stage, a transfer of electric charges in the forward direction by four stages, and the mixture process of the transferred electric charges and electric charges extracted from the vertical-horizontal transfer linking portion are performed in the horizontal transfer stage. The process performed during this period is the electric charge mixture process in the second line shown in FIG. 2. In this period, the electric charges mixed in the first line (e.g., output electric charges CTc and CTd in embodiment 1) move one stage ahead of the electric charges mixed in the second line in the forward direction.

After time t12, the electric charges mixed in the first and second lines (e.g., output electric charges CTc, CTd, DTc and DTd in embodiment 1) are transferred in the forward direction by two stages to be placed at positions shifted in the forward direction by one stage with respect to the electric charges which are extracted from the vertical-horizontal transfer linking portion at the start of the third line shown in FIG. 2.

Then, during a period from time t12 to time t18, a transfer of electric charges in the reverse direction by two stages, a transfer of electric charges in the reverse direction by two stages, a transfer of electric charges in the forward direction by one stage, a transfer of electric charges in the forward direction by four stages, a transfer of electric charges in the reverse direction by two stage, and the mixture process of the transferred electric charges and electric charges extracted from the vertical-horizontal transfer linking portion are performed in the horizontal transfer stage. The process performed during this period is the electric charge mixture process in the third line shown in FIG. 2. In this period, the electric charges mixed in the first and second lines (e.g., output electric charges CTc, CTd, DTc and DTd in embodiment 1) move one stage ahead of the electric charges mixed in the third line in the forward direction.

Immediately after time t18, the output electric charges are aligned as shown at the bottom of FIG. 2.

(Comparison of Mixture Methods of Embodiments 1 and 2)

Figure 16A:
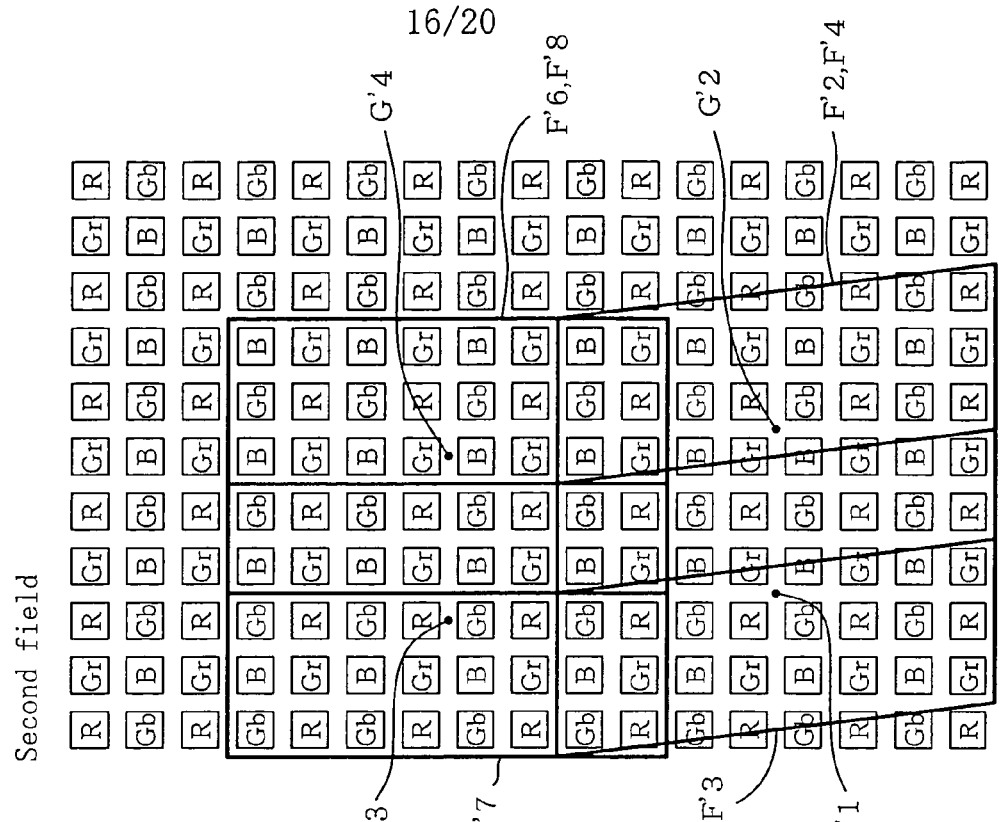
FIG. 16A and FIG. 16B show the relationship of the centroid in the pixel mixture of the first vertical line and the second vertical line for the first field and the second field, respectively, in embodiment 2.
Figure 16B:
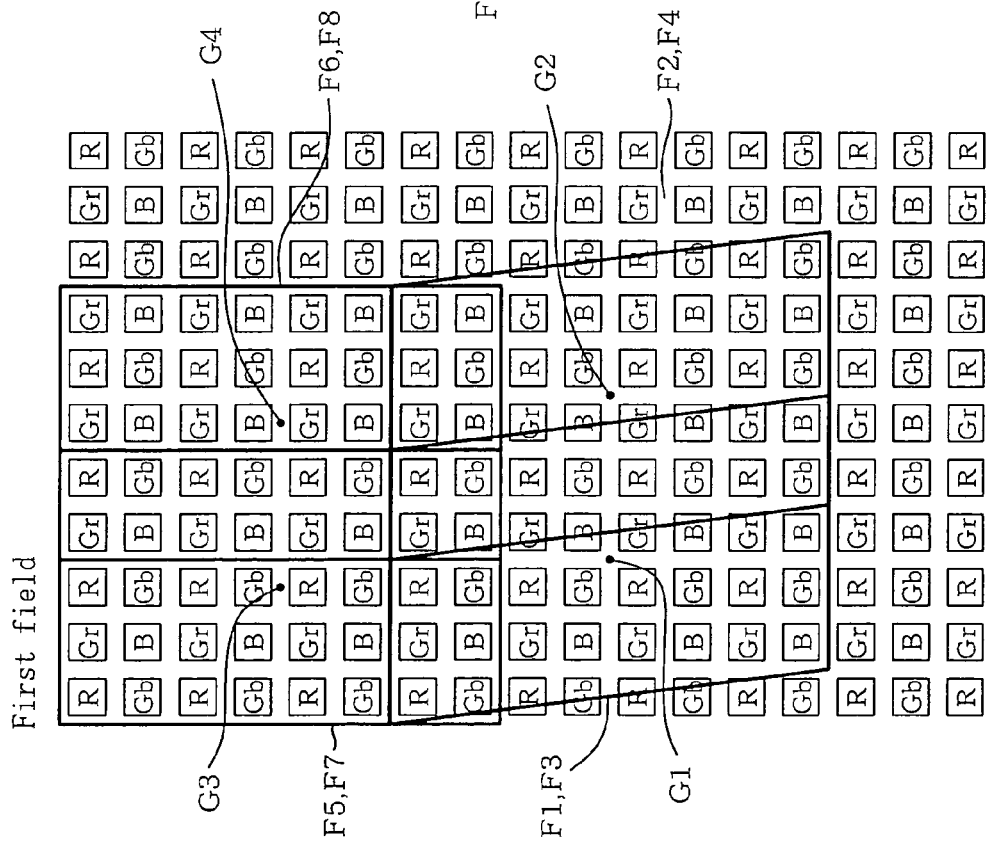

FIGS. 15A and 15B illustrate the relationship of the centroid positions of the pixel mixture in the first vertical line (odd-numbered line) and the second vertical line (even-numbered line) for the first field and the second field in embodiment 1. FIGS. 16A and 16B illustrate the relationship of the centroid positions of the pixel mixture in the first vertical line (odd-numbered line) and the second vertical line (even-numbered line) for the first field and the second field in embodiment 2.

In FIG. 15A, centroid B1 is the centroid of pixel mixture between the pixel mixture unit areas A1 and A3 in the first vertical line of the first field. Centroid B2 is the centroid of pixel mixture between the pixel mixture unit areas A2 and A4 in the first vertical line of the first field. Centroid B3 is the centroid of pixel mixture between the pixel mixture unit areas A5 and A7 in the second vertical line of the first field. Centroid B4 is the centroid of pixel mixture between the pixel mixture unit areas A6 and A8 in the second vertical line of the first field. In FIG. 15B, centroid B'1 is the centroid of pixel mixture between the pixel mixture unit areas A'1 and A'3 in the first vertical line of the second field. Centroid B'2 is the centroid of pixel mixture between the pixel mixture unit areas A'2 and A'4 in the first vertical line of the second field. Centroid B'3 is the centroid of pixel mixture between the pixel mixture unit areas A'5 and A'7 in the second vertical line of the second field. Centroid B'4 is the centroid of pixel mixture between the pixel mixture unit areas A'6 and A'8 in the second vertical line of the second field.

In FIG. 16A, centroid G1 is the centroid of pixel mixture between the pixel mixture unit areas F1 and F3 in the first vertical line of the first field. Centroid G2 is the centroid of pixel mixture between the pixel mixture unit areas F2 and F4 in the first vertical line of the first field. Centroid G3 is the centroid of pixel mixture between the pixel mixture unit areas F5 and F7 in the second vertical line of the first field. Centroid G4 is the centroid of pixel mixture between the pixel mixture unit areas F6 and F8 in the second vertical line of the first field. In FIG. 16B, centroid G'1 is the centroid of pixel mixture between the pixel mixture unit areas F'1 and F'3 in the first vertical line of the second field. Centroid G'2 is the centroid of pixel mixture between the pixel mixture unit areas F'2 and F'4 in the first vertical line of the second field. Centroid G'3 is the centroid of pixel mixture between the pixel mixture unit areas F'5 and F'7 in the second vertical line of the second field. Centroid G'4 is the centroid of pixel mixture between the pixel mixture unit areas F'6 and F'8 in the second vertical line of the second field.

As shown in FIG. 15A, in the horizontal direction, centroid B1 of pixel mixture in the first vertical line (odd-numbered line) of the first field is at the median point of centroids B3 and B4 of pixel mixture in the second vertical line (even-numbered line), and centroid B4 of pixel mixture in the second vertical line (even-numbered line) of the first field is at the median point of centroids B1 and B2 of pixel mixture in the first vertical line (odd-numbered line). That is, centroids B1, B2, . . . of pixel mixture in the first vertical line and centroids B3, B4, . . . of pixel mixture in the second vertical line respectively align with equal intervals over the horizontal coordinate system. The horizontal position of the centroid of pixel mixture in the third vertical line is equal to that of the centroid of pixel mixture in the first vertical line. This also applies to the pixel mixture in the second field as shown in FIG. 15B.

On the other hand, as shown in FIG. 16A, the horizontal position of centroid G1 of pixel mixture in the first vertical line (odd-numbered line) of the first field is at a position shifted from the median point of centroids G3 and G4 of pixel mixture in the second vertical line (even-numbered line), and the horizontal position of centroid G4 of pixel mixture in the second vertical line is at a position shifted from the median point of centroids G1 and G2 of pixel mixture in the first vertical line. This also applies to the pixel mixture in the second field as shown in FIG. 16B.

Figure 17A:
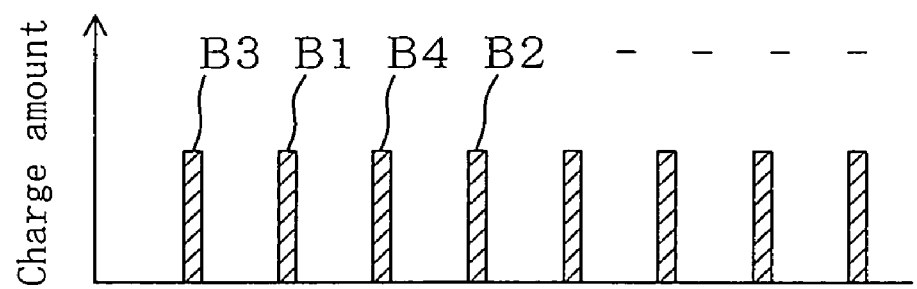
FIG. 17A illustrates the relationship between the centroid positions for pixel mixture in the first vertical line and the centroid positions for pixel mixture in the second vertical line for the example shown in FIGS. 15A and 15B.
Figure 17B:
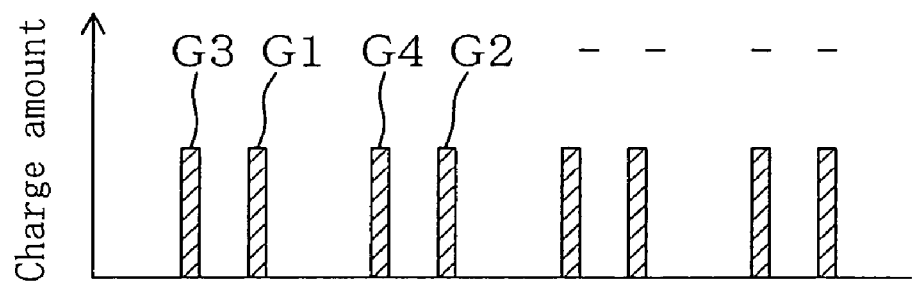
FIG. 17B illustrates the relationship between the centroid positions for pixel mixture in the first vertical line and the centroid positions for pixel mixture in the second vertical line for the example shown in FIGS. 16A and 16B.

FIG. 17A illustrates the relationship of the centroid positions of the pixel mixture in the first vertical line and the second vertical line in the example of FIGS. 15A and 15B. FIG. 17B illustrates the relationship of the centroid positions of the pixel mixture in the first vertical line and the second vertical line for the example of FIGS. 16A and 16B. As seen from FIG. 17A, in the case where the pixel mixture process of FIGS. 15A and 15B is performed, centroids B1, B2, . . . of pixel mixture in the first vertical line and centroids B3, B4, . . . of pixel mixture in the second vertical line respectively align with equal intervals over the horizontal coordinate system. As seen from FIG. 17B, in the case where the pixel mixture process of FIGS. 16A and 16B is performed, centroids G1, G2, . . . of pixel mixture in the first vertical line and centroids G3, G4, . . . of pixel mixture in the second vertical line respectively align with unequal intervals over the horizontal coordinate system.

Figure 18:
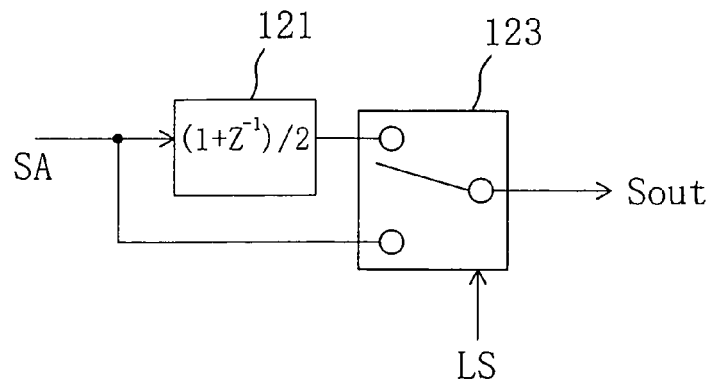
FIG. 18 is a block circuit diagram simply showing the structure of a centroid position correction circuit.
Figures 19A, 19B:
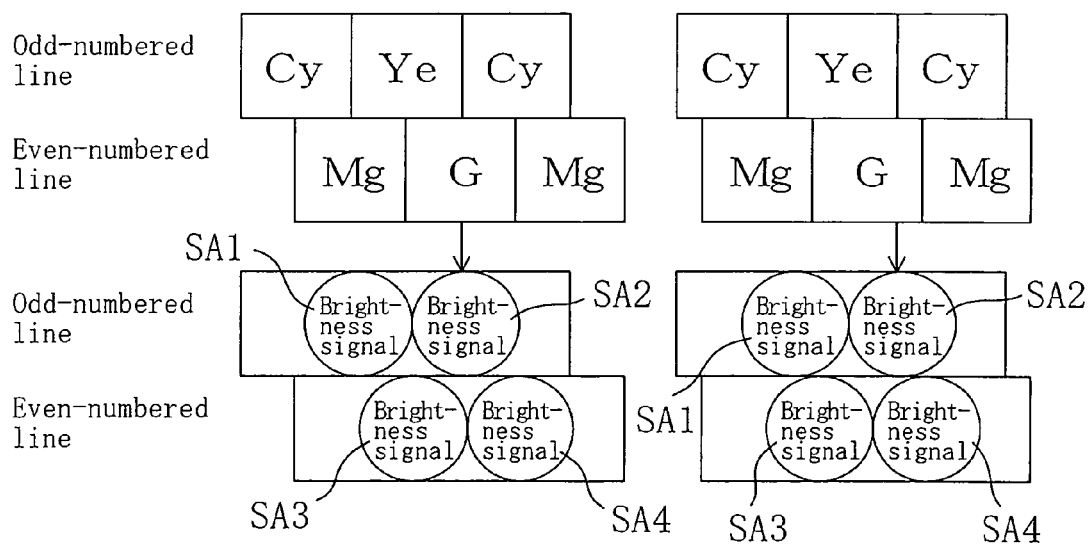
FIG. 19A illustrates the process of generating a brightness signal by adding together electric charge signals of a pixel mixture unit area for the example shown in FIGS. 15A and 15B.
FIG. 19B illustrates the process of generating a brightness signal by adding together electric charge signals of a pixel mixture unit area for the example shown in FIGS. 16A and 16B.

FIG. 18 is a block diagram simply showing a structure of a centroid position correction circuit. FIG. 19A illustrates an example of adding together the electric charges in a pixel mixture unit area to generate a brightness signal in the example of FIGS. 15A and 15B. FIG. 19B illustrates an example of adding together the electric charges in a pixel mixture unit area to generate a brightness signal in the example of FIGS. 16A and 16B.

As shown in FIG. 18, the centroid position correction circuit includes an arithmetic operation circuit 121 which performs the operation of $(1+z^{-1})/2$ and a switching circuit 123. The centroid position correction circuit receives brightness signal SA obtained by adding together electric charge signals of adjacent pixel mixture unit areas. If brightness signal SA is a brightness signal of a reference line (odd-numbered line or even-numbered line), the switching circuit 123 is connected to the lower terminal in the drawing according to control signal LS, and a signal which has bypassed the arithmetic operation circuit 121 is output as signal Sout. If brightness signal SA is a brightness signal of a line other than the reference line (even-numbered line or odd-numbered line), the switching circuit 123 is connected to the upper terminal in the drawing according to control signal LS, and a signal which has undergone the operation of $(1+z^{-1})/2$ for centroid position correction in the arithmetic operation circuit 121 is output as signal Sout. The operation of $(1+z^{-1})/2$ is a process for interpolating a new brightness signal at the median point of the brightness signals.

According to embodiment 3, in a solid state imaging element, when a pixel mixture process is performed, a pixel signal of complementary color filter format is output. Now, consider an example where pixel signals of the colors shown in the upper part of FIGS. 19A and 19B are input as pixel signals of an odd-numbered line and an even-numbered line. In the odd-numbered line, a Cy-pixel signal and a Ye-pixel signal, which are the pixel signals of adjacent pixel mixture unit areas, are mixed to generate brightness signal SA1, and a Ye-pixel signal and a Cy-pixel signal, which are the pixel signals of adjacent pixel mixture unit areas, are mixed to generate brightness signal SA2. In the even-numbered line, a Mg-pixel signal and a G-pixel signal, which are the pixel signals of adjacent pixel mixture unit areas, are mixed to generate brightness signal SA3, and a G-pixel signal and a Mg-pixel signal, which are the pixel signals of adjacent pixel mixture unit areas, are mixed to generate brightness signal SA4.

In the case where the odd-numbered line is a reference line, the switching circuit 123 is controlled such that brightness signals SA1 and SA2 of the odd-numbered line bypass the arithmetic operation circuit 121 and are output as output signal Sout, and the centroid position correcting process is not performed. On the other hand, brightness signals SA3 and SA4 of the even-numbered line are input to the arithmetic operation circuit 121 and undergo the centroid position correcting process, and the corrected brightness signals are output as output signal Sout. In such a case, if the centroid positions of the mixed electric charge signals of pixel mixture unit areas in an odd-numbered line are at the median points of the centroid positions of the mixed electric charge signals of pixel mixture unit areas in an even-numbered line and vice verse over the horizontal coordinate system as shown in FIGS. 15A and 15B, brightness signals SA1 and SA2 in the odd-numbered line are at the median points of brightness signals SA3 and SA4 in the even-numbered line, and vice versa, as shown in FIG. 19A. Therefore, the centroid positions of brightness signals SA3 and SA4 in the even-numbered line are readily corrected by the operation of $(1+z^{-1})/2$ in the arithmetic operation circuit 121 to be coincident with the centroid positions of brightness signals SA1 and SA2 in the odd-numbered line. In the case where the even-numbered line is a reference line, the process opposite to that described above is performed, whereby the centroid positions are readily corrected.

However, if the centroid positions of the mixed electric charge signals of pixel mixture unit areas in an odd-numbered line are not at the median points of the centroid positions of the mixed electric charge signals of pixel mixture unit areas in an even-numbered line and vice verse over the horizontal coordinate system as shown in FIGS. 16A and 16B, brightness signals SA1 and SA2 in the odd-numbered line and brightness signals SA3 and SA4 in the even-numbered line are shifted from the centroid positions of each other as shown in FIG. 19B. Thus, in order to correct the centroid positions of brightness signals SA3 and SA4 of the even-numbered line so as to be coincident with the centroid positions of brightness signals SA1 and SA2 of the odd-numbered line, a circuit structure capable of more complicated processes is required instead of using the circuit of FIG. 18.

Thus, the centroid positions of pixel mixture in the odd-numbered line are aligned to be at the median points of the centroid positions of pixel mixture in the even-numbered line and vice versa as shown in FIGS. 15A and 15B. With such a structure, the process of correcting the centroid positions is simplified, and reproduction of images is quickly performed. As a result, in the reproduction of moving pictures, sharp images are obtained more readily.

Thus, for example, in the case where the two pixel mixture unit areas which are mixed in the pixel mixture process of the first vertical line (odd-numbered line) are two pixel mixture unit areas which are horizontally shifted from each other by one pixel and mixed in a zigzag manner, and the two pixel mixture unit areas which are mixed in the pixel mixture process of the second vertical line (even-numbered line) are two pixel mixture unit areas which are at the same horizontal position and mixed in a non-zigzag manner, it is preferable that the two pixel mixture unit areas which are mixed in a zigzag manner are horizontally shifted by one pixel with respect to the two pixel mixture unit areas which are mixed in a non-zigzag manner.

In other words, in the case where the repetition unit which constitutes the basis of arrangement of pixel mixture unit areas is formed by 4 vertically-arranged pixel mixture unit areas which are mixed on a two-by-two basis, it is preferable that the position of one pixel mixture unit area is horizontally shifted by one pixel, and another one is horizontally shifted by two pixels.

In the above-described embodiments, in a moving picture imaging process with a mega-pixel solid state imaging element of a color filter arrangement where the unit area is 2 rows×2 columns, aliasing components derived from high frequency components in a low frequency range are greatly reduced even when an image including a high frequency signal in both horizontal and vertical directions of a video signal is imaged. As a result, false signals in both the brightness signal and chromaticity signal are greatly suppressed. Further, a perfect equilibrium of the pixel sampling density is achieved between the horizontal direction and the vertical direction, so that the horizontal resolution and the vertical resolution are equal. Furthermore, data from all of the pixels can be output without abandonment, and therefore, the sensitivity of the imaging element is greatly improved. Further still, even when the number of pixels of a solid state imaging element is increased, the number of output pixels which is optimal to the interlaced scanning mode can be selected by expanding the pixel mixture area for increasing the frame rate vertically and/or horizontally according to the application of the element.

(Variations)

The above-described embodiments have disclosed a solid state imaging device including vertical transfer stages and a horizontal transfer stage through which electric charges obtained from CCDs are transferred. However, the present invention is not limited to the above embodiments. For example, the present invention is applicable to a solid state imaging device which performs addition of electric charges obtained from MOSFETs.

The solid state imaging element of the present invention does not necessarily have a color filter. The present invention is applicable to the processes of monochromic (black/white) images. Further, even in the case of using a color filter, the color filter does not need to include a color pattern of 2 rows×2 columns as a basic unit of repetition. For example, the solid state imaging element may include a multicolor filter of 5 or more colors.

In the above-described embodiments, the pixel mixture unit area is formed by 5×5 pixels, but the present invention is not limited thereto. The pixel mixture unit area may be formed by a larger or smaller number pixels for the pixel mixture process.

This specification does not disclose an example where embodiment 1 is applied to a solid state imaging element of a complementary color filter format. However, the filter structure of embodiment 1 may be a complementary color filter structure as embodiment 3 is realized based on embodiment 2 by replacing the filter format of embodiment 2 with a complementary color filter format.

In the above-described embodiments, the number of pixels in the vertical direction (i.e., in a column) in the pixel mixture unit area, q, satisfies the relationship of q=4m+1 (m is a natural number), the number of pixels in the horizontal direction (i.e., in a row), p, satisfies the relationship of p=4n+1 (n is a natural number), and the relationship of m=n=1 is satisfied. The pixel mixture unit areas overlap one another by (q+1)/2 pixels in the first (vertical) direction and by (p+1)/2 pixels in the second (horizontal) direction to form an arrangement which has a two-dimensional repetition. However, according to the present invention, the number of pixels in the pixel mixture unit area and the amount of the overlap are not limited to the above embodiments.

In one possible example of the present invention, the number of pixels in the first direction (i.e., in a column) in the pixel mixture unit area, q, satisfies the relationship of q=4m−1 (m is a natural number), the number of pixels in the second direction (i.e., in a row), p, satisfies the relationship of p=4n−1 (n is a natural number), and the pixel mixture unit areas repeatedly overlap one another alternately by (q−1)/2 pixels and (q+3)/2 pixels in the first direction and alternately by (p−1)/2 pixels and (p+3)/2 pixels in the second direction to constitute an arrangement which has a two-dimensional repetition.

The pixel mixture unit area may include an even number of pixels×an even number of pixels, e.g., 6 pixels×6 pixels. Alternatively, the pixel mixture unit area may include an odd number of pixels×an even number of pixels.

The above-described solid state imaging device of the present invention can be used for digital still cameras, digital video cameras, etc.

What is claimed is:

1. A solid state imaging device, comprising:
    a solid state imaging element including a plurality of photoelectric conversion elements arranged in a matrix, the solid state imaging element including pixels grouped into pixel mixture unit areas, each of which includes q pixels (q is a natural number equal to or greater than 2) in the first direction of the solid state imaging element and p pixels (p is a natural number equal to or greater than 2) in the second direction that crosses the first direction;
    pixel addition means for performing a first-field pixel addition process of adding together electric charges of a plurality of pixels included in the plurality of pixel mixture unit areas and a second-field pixel addition process of adding together the electric charges of the plurality of pixels included in the plurality of pixel mixture unit areas based on a combination of the pixel mixture unit areas which is different from that of the first-field pixel addition process; and
    output means for alternately outputting signals of the electric charges obtained in the first-field pixel addition process and second-field pixel addition process as signals for interlaced scanning.

2. The solid state imaging device of claim 1, wherein the pixel mixture unit areas overlap one another in the first and second directions to constitute an arrangement which has a two-dimensional repetition.

3. The solid state imaging device of claim 2, wherein:
    the number of pixels in the first direction in each of the pixel mixture unit areas, q, satisfies the relationship of q=4m+1 (m is a natural number), and the number of pixels in the second direction in each of the pixel mixture unit areas, p, satisfies the relationship of p=4n+1 (n is a natural number); and
    the pixel mixture unit areas overlap one another by (q+1)/2 pixels in the first direction and by (p+1)/2 pixels in the second direction.

4. The solid state imaging device of claim 2, wherein:
    the number of pixels in the first direction in each of the pixel mixture unit areas, q, satisfies the relationship of q=4m−1 (m is a natural number), and the number of pixels in the second direction in each of the pixel mixture unit areas, p, satisfies the relationship of p=4n−1 (n is a natural number); and
    the pixel mixture unit areas repeatedly overlap one another alternately by (q−1)/2 pixels and (q+3)/2 pixels in the first direction and alternately by (p−1)/2 pixels and (p+3)/2 pixels in the second direction.

5. The solid state imaging device of claim 2, wherein:
    electric charges of a plurality of pixels included in one pixel mixture unit area are added together in the first direction; and
    the electric charges of the pixels which are added together respectively in the plurality of pixel mixture unit areas and transferred in the first direction are added together in the second direction.

6. The solid state imaging device of claim 2, wherein:
    the pixel addition means performs a plurality of line processes on two of the pixel mixture unit areas which are adjacent in the first direction wherein electric charges of the plurality of pixels included in the two pixel mixture unit areas are added together; and
    in at least one of the plurality of line processes, two of the pixel mixture unit areas which are shifted in the second direction by one or more pixels are processed.

7. The solid state imaging device of claim 6, wherein the centroid position of a first region formed by two of the pixel mixture unit areas which are processed in one of the line processes is on a line that extends in the first direction and passes over the median point between the centroid position of a second region formed by two of the pixel mixture unit areas which are processed in another one of the line processes and the centroid position of a third region formed by two of the pixel mixture unit areas which is processed at the same time with the second region and is placed adjacent to the second region in the second direction.

8. The solid state imaging device of claim 1, wherein the solid state imaging element includes a color filter provided over front faces of the photoelectric conversion elements.

9. The solid state imaging device of claim 8, wherein:
    a color filter arrangement of the solid state imaging element is a combination of Bayer arrangements of 2 rows×2 columns;
    the pixel addition means includes a first-direction transfer stage for adding together electric charges of the plurality of pixels in the first direction in each of the pixel mixture unit areas and a second-direction transfer stage for adding together the electric charges obtained by the addition in the first-direction transfer stage in the second direction; and the electric charges obtained by the addition in the second-direction transfer stage are pixel signals for complementary color filter arrangement display.

10. The solid state imaging device of claim 8, wherein a color filter arrangement of the solid state imaging element is a combination of four colors, cyan, yellow, green and magenta, arranged in 2 rows×2 columns.

11. The solid state imaging device of claim 1, wherein the pixel addition means includes a first-direction transfer stage and a second-direction transfer stage, the first-direction transfer stage including a plurality of CCDs which transfer the electric charges of the pixels in the first direction, the second-direction transfer stage including a plurality of CCDs which transfer the electric charges transferred from the first-direction transfer stage in the second direction.

12. The solid state imaging device of claim 11, wherein:
the second-direction transfer stage alternately includes a storage region which includes a first gate and retains an electric charge and a barrier region which includes a second gate and functions as a barrier against transfer of electric charges; and
the first gate and the second gate are electrically separated to receive separate biases.

13. A method for driving a solid state imaging device which includes a solid state imaging element including a plurality of photoelectric conversion elements arranged in a matrix, the solid state imaging element including pixels grouped into pixel mixture unit areas, each of which includes q pixels (q is a natural number equal to or greater than 2) in the first direction of the solid state imaging element and p pixels (p is a natural number equal to or greater than 2) in the second direction that crosses the first direction, the method comprising the steps of:
(a) adding together electric charges of pixels included in each of the pixel mixture unit areas and transferring the added electric charges in the first direction;
(b) adding together electric charges of pixels from a plurality of pixel mixture unit areas while the electric charges added and transferred in the first direction at step (a) are transferred in the second direction; and (c) alternately outputting signals which relates to the electric charges added together at step (b) in first and second fields as signals for interlaced scanning.

14. The method of claim 13, wherein the pixel mixture unit areas overlap one another in the first and second directions to constitute a two-dimensional repetition arrangement.

15. The method of claim 13, wherein:
at step (a), electric charges of pixels included in one pixel mixture unit area are added together in the first direction; and
at step (b), the electric charges added together in the first direction at step (a) are added together in the second direction.

16. The method of claim 15 wherein, at step (b), a line process of adding together in the second direction electric charges of pixels of two pixel mixture unit areas which are adjacent in the first direction is performed over a plurality of stages.

17. The method of claim 13, wherein the solid state imaging element includes a color filter provided over front faces of the photoelectric conversion elements.

18. The method of claim 17, wherein:
a color filter arrangement of the solid state imaging element is a combination of Bayer arrangements of 2 rows×2 columns; and
at step (b), electric charges of pixels having different colors in each of the pixel mixture unit areas are added together to generate a pixel signal for a complementary color filter arrangement.

19. The method of claim 17, wherein a color filter arrangement of the solid state imaging element is a combination of four colors, cyan, yellow, green and magenta, arranged in 2 rows×2 columns.

20. The method of claim 13, wherein:
step (a) uses a first-direction transfer stage including a plurality of CCDs which transfer the electric charges of the pixels in the first direction; and
step (b) uses a second-direction transfer stage including a plurality of CCDs which transfer the electric charges transferred from the first-direction transfer stage in the second direction.

* * * * *